(12) United States Patent
Lee et al.

(10) Patent No.: US 9,674,940 B2
(45) Date of Patent: Jun. 6, 2017

(54) ELECTRONIC DEVICE AND SEMICONDUCTOR PACKAGE WITH THERMALLY CONDUCTIVE VIA

(71) Applicant: Samsung Electronics Co., Ltd., Suwon-si (KR)

(72) Inventors: Eung-chang Lee, Seoul (KR); Seok-jae Han, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/826,207

(22) Filed: Aug. 14, 2015

(65) Prior Publication Data

US 2016/0050744 A1 Feb. 18, 2016

(30) Foreign Application Priority Data

Aug. 14, 2014 (KR) .................. 10-2014-0105710
Jul. 9, 2015 (KR) .................. 10-2015-0097866

(51) Int. Cl.
*H05K 1/00* (2006.01)
*H05K 1/02* (2006.01)
(Continued)

(52) U.S. Cl.
CPC ....... *H05K 1/0206* (2013.01); *H01L 23/3677* (2013.01); *H01L 23/49822* (2013.01); *H01L 24/00* (2013.01); *H05K 1/115* (2013.01); *H01L 24/45* (2013.01); *H01L 25/0652* (2013.01); *H01L 25/0657* (2013.01); *H01L 2224/05553* (2013.01); *H01L 2224/16225* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48147* (2013.01); *H01L 2224/48227* (2013.01); *H01L 2224/49175* (2013.01); *H01L 2224/73204* (2013.01); *H01L 2224/73265* (2013.01);
(Continued)

(58) Field of Classification Search
CPC . H05K 1/02; H05K 7/20; H01L 23/10; H01L 23/31; H01L 23/34; H01L 23/42; H01L 23/52; H01L 23/58; H01L 23/64; H01L 23/66
USPC ........ 174/252, 266; 361/704, 719, 720, 760, 361/767; 257/664, 707, 738, 712
See application file for complete search history.

(56) References Cited

U.S. PATENT DOCUMENTS 4,739,448 A * 4/1988 Rowe ...................... H01L 23/66
333/238
5,506,755 A * 4/1996 Miyagi ............... H01L 23/3677
174/252
(Continued)

FOREIGN PATENT DOCUMENTS

JP    11-121675    4/1999
JP    2009-176839  8/2009
(Continued)

*Primary Examiner* — Xiaoliang Chen
(74) *Attorney, Agent, or Firm* — Muir Patent Law, PLLC

(57) ABSTRACT

An electronic device and semiconductor package include a printed circuit board and a semiconductor device mounted thereon. The printed circuit board includes one or more thermally conductive vias for dissipating heat.

14 Claims, 26 Drawing Sheets

(51) Int. Cl.
  *H05K 1/11* (2006.01)
  *H01L 23/00* (2006.01)
  *H01L 23/367* (2006.01)
  *H01L 23/498* (2006.01)
  *H01L 25/065* (2006.01)

(52) U.S. Cl.
  CPC ........... *H01L 2225/0651* (2013.01); *H01L 2225/06506* (2013.01); *H01L 2225/06562* (2013.01); *H01L 2924/181* (2013.01); *H05K 1/113* (2013.01); *H05K 2201/096* (2013.01); *H05K 2201/09345* (2013.01); *H05K 2201/10159* (2013.01); *H05K 2201/10674* (2013.01); *H05K 2201/10969* (2013.01)

(56) References Cited

U.S. PATENT DOCUMENTS

| | | | | |
|---|---|---|---|---|
| 5,923,084 | A * | 7/1999 | Inoue | H01L 23/3121 257/712 |
| 5,952,709 | A * | 9/1999 | Kitazawa | H05K 1/0243 257/275 |
| 5,982,630 | A * | 11/1999 | Bhatia | H05K 1/0207 216/20 |
| 6,014,313 | A | 1/2000 | Hesselbom | |
| 6,350,952 | B1 * | 2/2002 | Gaku | H01L 21/4857 174/522 |
| 6,377,464 | B1 * | 4/2002 | Hashemi | H01L 23/552 257/516 |
| 6,483,702 | B1 | 11/2002 | Lofland et al. | |
| 6,819,566 | B1 | 11/2004 | Danovitch et al. | |
| 6,954,360 | B2 * | 10/2005 | Nurminen | H01L 23/3677 174/252 |
| 7,161,239 | B2 * | 1/2007 | Zhao | H01L 23/24 257/706 |
| 7,906,844 | B2 * | 3/2011 | Cui | H01L 25/0657 257/707 |
| 7,960,827 | B1 * | 6/2011 | Miller, Jr. | H01L 23/3677 257/712 |
| 7,973,400 | B2 | 7/2011 | Paek et al. | |
| 8,009,429 | B1 * | 8/2011 | Sundstrom | H01L 23/36 257/706 |
| 8,310,067 | B2 | 11/2012 | Zhao et al. | |
| 8,704,341 | B2 | 4/2014 | Lin et al. | |
| 8,737,073 | B2 | 5/2014 | Yeh et al. | |
| 8,786,067 | B2 | 7/2014 | Paek et al. | |
| 2002/0084524 | A1 * | 7/2002 | Roh | H01L 23/3128 257/738 |
| 2005/0189588 | A1 * | 9/2005 | Ma | H01L 21/76898 257/343 |
| 2007/0120250 | A1 * | 5/2007 | Fairchild | H01L 23/3677 257/712 |
| 2011/0039375 | A1 * | 2/2011 | Nakagawa | H01L 23/49811 438/121 |
| 2011/0292124 | A1 * | 12/2011 | Anderson | B41J 2/14072 347/44 |
| 2014/0043783 | A1 * | 2/2014 | Ohira | H05K 1/0207 361/767 |
| 2014/0048313 | A1 * | 2/2014 | Pan | H05K 1/0271 174/252 |
| 2014/0133104 | A1 | 5/2014 | Delgado et al. | |

FOREIGN PATENT DOCUMENTS

| | | |
|---|---|---|
| JP | 2012-195466 | 10/2012 |
| JP | 2013-135168 | 7/2013 |
| JP | 2014-099606 | 5/2014 |
| KR | 10-2001-0063109 | 7/2001 |
| KR | 10-0885911 | 2/2009 |
| KR | 10-1006063 | 1/2011 |
| KR | 10-2013-0107780 | 10/2013 |

* cited by examiner

ELECTRONIC DEVICE AND SEMICONDUCTOR PACKAGE WITH THERMALLY CONDUCTIVE VIA

CROSS-REFERENCE TO RELATED APPLICATIONS

This application claims the benefit of priority to Korean Patent Application No. 10-2014-0105710, filed on Aug. 14, 2014, and Korean Patent Application No. 10-2015-0097866, filed on Jul. 9, 2015, in the Korean Intellectual Property Office, the disclosures of which are incorporated herein in their entireties by reference.

BACKGROUND

The present disclosure relates to a semiconductor packages, and heat dissipation in semiconductor packages.

In semiconductor industries, packaging technologies for integrated circuits have continuously advanced so as to satisfy a demand for a miniaturization. Recently, as semiconductor devices have become highly integrated, electrical characteristics have been degraded due to heat generated in packages. Accordingly, there is a desire for a technology capable of maximizing both of high integration and heat dissipation effect.

SUMMARY

The disclosed embodiments provide an electronic device and a semiconductor package that includes thermally conductive components arranged to dissipate heat, and which thereby assist in maintaining reliability of the electronic device and semiconductor package and preventing the degradation of electrical characteristics due to heat generated in a highly integrated semiconductor package.

BRIEF DESCRIPTION OF THE DRAWINGS

Exemplary embodiments of the inventive concept will be more clearly understood from the following detailed description taken in conjunction with the accompanying drawings in which.

Figure 1A:
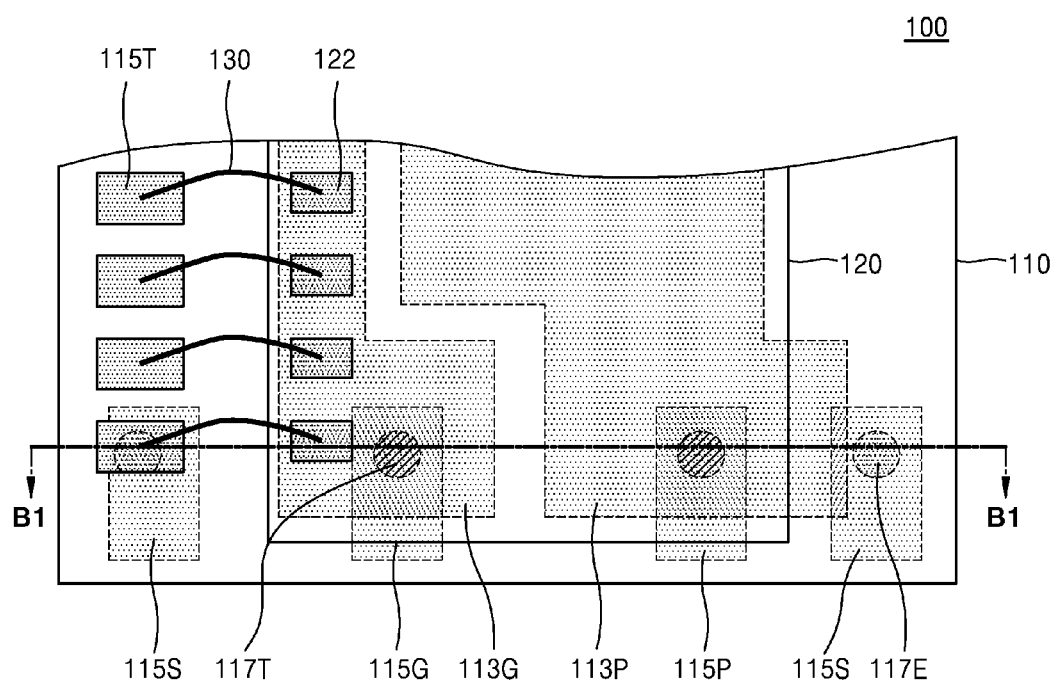
FIG. 1A is a plan view of a semiconductor package according to certain exemplary embodiments of the inventive concept.

Though the different figures show variations of exemplary embodiments, these figures are not intended to be mutually exclusive from each other. Rather, as will be seen from the context of the detailed description below, certain features depicted and described in different figures can be combined with other features from other figures to result in various embodiments, when taking the figures and their description as a whole.

DETAILED DESCRIPTION

The present disclosure will now be described more fully with reference to the accompanying drawings, in which exemplary embodiments of the inventive concept are shown. The inventive concept may, however, be embodied in many different forms and should not be construed as being limited to the exemplary embodiments set forth herein. As used herein, the term "and/or" includes any and all combinations of one or more of the associated listed items. Expressions such as "at least one of," when preceding a list of elements, modify the entire list of elements and do not modify the individual elements of the list. As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first", "second", "third", etc. may be used herein to describe various elements, these elements should not be limited by these terms. Unless the context indicates otherwise, these terms are only used to distinguish one element from another, for example as a naming convention. For example, a first element discussed below in one section of the specification may be referred to as a second element in a different section of the specification or in the claims, and similarly, a second element may be referred to as a first element without departing from the scope of protection of the inventive concept. In addition, in certain cases, even if a term is not described using "first," "second," etc., in the specification, it may still be referred to as "first" or "second" in a claim in order to distinguish different claimed elements from each other.

Unless otherwise defined, all terms used herein, including technical and scientific terms, have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

Embodiments described herein will be described referring to plan views and/or cross-sectional views by way of ideal schematic views. In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," or "in contact with" as used herein refers to direct contact (i.e., touching) unless the context indicates otherwise.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" or "substantial" may be used herein to reflect this meaning.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which heat-insulative materials significantly prevent heat transfer between the two components, or only allow for incidental heat transfer, are not to be treated as thermally connected or in thermal communication with each other. The terms "heat-conductive" or "thermally-conductive" do not apply to a particular material simply because it provides incidental heat conduction, but these terms are intended to refer to materials that are typically known as good heat conductors or known to have utility for transferring heat, or components having similar heat conducting properties as those materials.

Figure 1B:
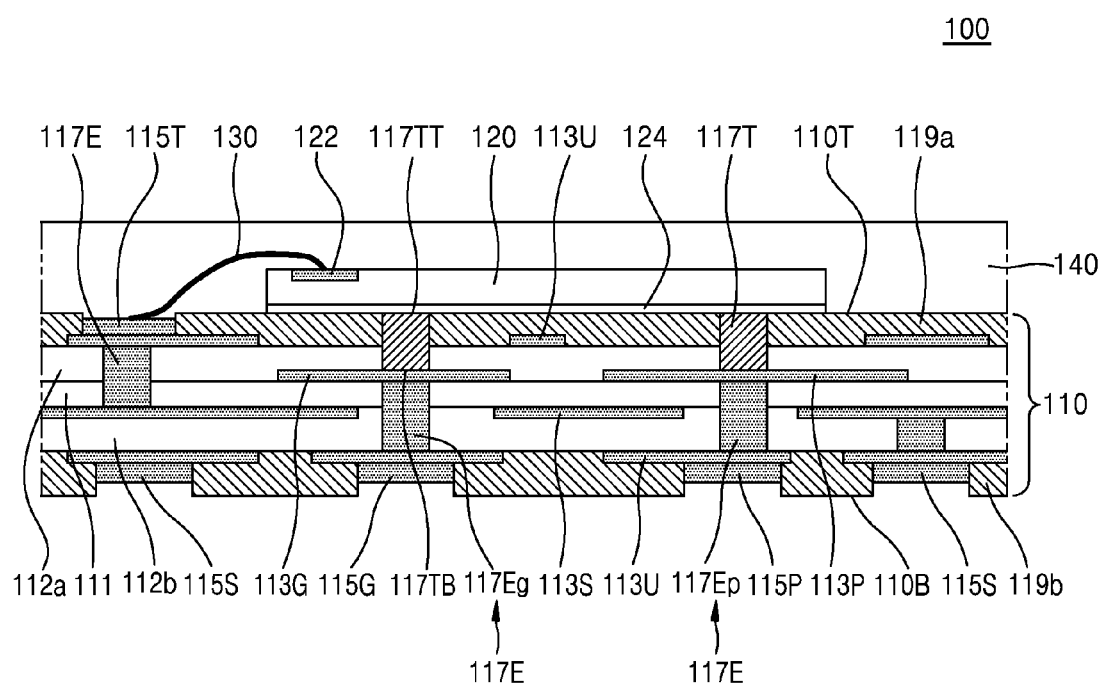
FIG. 1B is a cross-sectional view taken along line B1-B1 of FIG. 1A, according to certain exemplary embodiments of the inventive concept.

FIG. 1A is a plan view of a semiconductor package 100 according to certain exemplary embodiments of the inventive concept. FIG. 1B is a cross-sectional view taken along line B1-B1 of FIG. 1A, according to certain exemplary embodiments.

Referring to FIGS. 1A and 1B, the semiconductor package 100 may include a printed circuit board (PCB) 110, a semiconductor device 120, a bonding wire 130, and a mold part 140.

As used herein, a semiconductor device may refer to any of the various devices such as shown in FIGS. 1A-10D, and may also refer, for example, a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc. As discussed herein, certain features assist in heat dissipation of semiconductor devices. These same features may also assist in heat dissipation of electronic devices that include these semiconductor devices.

A specific shape, a placement structure, and a layout of the PCB 110 and the semiconductor device 120 illustrated in FIG. 1A are only for illustrative purposes and may be variously modified without departing from the scope of the inventive concept.

In FIG. 1A, illustrations of some configurations of the semiconductor package 100, such as a signal pattern layer 113S and protection layers 119a and 119b, will be omitted for clarity of description.

The PCB 110 may be a multi-layer PCB including a plurality of wiring pattern layers 113P, 113G, 113S, and 113U thereinside. Specifically, the PCB 110 may include a base layer 111, wiring pattern layers 113P, 113G, and 113S, prepreg layers 112a and 112b, peripheral wiring pattern layers 113U, vias 117E and 117T, pads 115S, 115G, 115P, and 115T, and protection layers 119a and 119b. The wiring pattern layers 113P, 113G, and 113S may be disposed on a top surface and a bottom surface of the base layer 111, respectively. The prepreg layers 112a and 112b may cover the wiring pattern layers 113P, 113G, and 113S, respectively. The peripheral wiring pattern layers 113U may be disposed on the prepreg layers 112a and 112b. The vias 117E and 117T may penetrate at least one of the base layer 111 and the prepreg layers 112a and 112b.

In some embodiments, the PCB 110 may be a rigid PCB or a flexible PCB. The PCB 110 may also be generally referred to herein as a package substrate.

The base layer 111 may be formed, for example, of an electrically insulative material, and may include at least one selected from the group consisting of an epoxy resin, a polyimide resin a bismaleimide triazine (BT) resin, a flame retardant 4 (FR-4), an FR-5, a photosensitive liquid dielectric, a photosensitive dry-film dielectric, a polyimide flexible film thermally cured dry film, a thermally cured liquid dielectric, a thermoplastic, a flexible resin, ceramic, silicon, and glass. The base layer 111 may form a core layer of the PCB 110.

The wiring pattern layers 113P, 113G, and 113S may be disposed on the top surface and the bottom surface of the base layer 111, respectively. For example, a ground pattern layer 113G and a power pattern layer 113P may be disposed on the top surface of the base layer 111, and a signal pattern layer 113S may be disposed on the bottom surface of the base layer 111. The wiring pattern layers 113P, 113G, and 113S may be covered by the prepreg layers 112a and 112b. Though the cross-sectional view of FIG. 1B does not show all of the connections between electrically conductive components, FIG. 1A shows in general that the wiring pattern layers described herein may have various shapes or sizes, and may connect to different other components (such as other wiring pattern layers, conductive vias, pads, etc.) in different ways.

The wiring pattern layers 113P, 113G, and 113S may include, for example, at least one conductive material selected from the group comprising copper (Cu), aluminium (Al), nickel (Ni), palladium (Pd), silver (Ag), chromium (Cr), titanium (Ti), and gold (Au). In addition, the wiring pattern layers 113P, 113G, and 113S may include a multi-layer of the aforementioned conductive materials. However, the conductive materials are merely exemplified and are not limited thereto.

In certain exemplary embodiments, the ground pattern layer 113G and the power pattern layer 113P may be disposed at the same level on the top surface of the base layer 111, and the signal pattern layer 113S may be disposed on the bottom surface of the base layer 111, but the placement structure of the wiring pattern layers 113P, 113G, and 113S are not limited thereto.

Furthermore, in certain exemplary embodiments, the wiring pattern layers 113P, 113G, and 113S are disposed in two layers but are not limited thereto. For example, unlike as in FIG. 1B, the wiring pattern layers 113P, 113G, and 113S may be disposed in one layer and may be disposed in three or more layers.

Upper pads 115T may be disposed at a top surface 110T of the PCB 110 to electrically connect the PCB 110 and the semiconductor device 120. Lower pads 115S, 115G, and 115P may be disposed at a bottom surface 110B of the PCB 110 to connect the semiconductor package 100 to external devices (not illustrated). As such, the various pads described herein may be formed of conductive materials formed at a surface of a device such as a surface of a semiconductor chip or a surface of a PCB or package substrate.

Electrically conductive vias 117E may be formed in the PCB 110 to connect the pads 115S, 115G, 115P, and 115T and the wiring pattern layers 113P, 113G, and 113S. Specifically, the upper pads 115T may be connected to the signal pattern layer 113S in the PCB 110 through the electrically conductive vias 117E, and the ground pad 115G, the power pad 115P, and the signal pad 115S may be connected to the ground pattern layer 113G, the power pattern layer 113P, and the signal pad layer 113S in the PCB 110 through the electrically conductive vias 117E, respectively.

In some exemplary embodiments, as illustrated in FIG. 1, the peripheral wiring pattern layers 113U may be disposed between the pads 115S, 115G, 115P, and 115T and the electrically conductive vias 117E, but the inventive concept is not limited thereto.

The electrically conductive vias 117E may include, for example, at least one conductive material selected from the group consisting of Cu, Al, Ni, Pd, Ag, Cr, Ti, and Au but are not limited thereto.

The ground pads, power pads, and signal pads described herein are configured and positioned in certain manners. For example, ground pads described herein are generally for connecting to a ground outside of the semiconductor package 100, and may be electrically connected to circuitry of the semiconductor device 120, in order to provide ground voltage to the semiconductor device 120. Power pads described herein are generally for connecting to a power source (e.g., a voltage source) outside the semiconductor package 100, and may be electrically connected to circuitry of the semiconductor device 120 for providing power voltage to the first semiconductor device 120.

The protection layers 119A and 119B may be respectively disposed on a top surface of the prepreg layer 112a and a bottom surface of the prepreg layer 112b to protect the peripheral wiring layers 113U from the outside. The protection layers 119a and 119b may function to prevent defects of the PCB 110 caused by a leakage current and prevent the degradation caused by oxygen and moisture by preventing an inside of the PCB 110 from being exposed to air.

In certain embodiments, the protection layers 119a and 119b may expose only the pads 115S, 115G, 115P, and 115T and may cover all of the remaining regions. The protection layers 119a and 119b may include, for example, at least one selected from the group comprising a solder resist (SR), a dry film resist (DFR), an electro deposition resist, and a screen resist.

In the certain exemplary embodiments, such as depicted in FIGS. 1A and 1B, the protection layers 119a and 119b are formed as a non solder mask define (NSMD) type configured to wholly expose the pads 115S, 115G, 115P, and 115T. But the embodiments are not limited thereto. In some cases, the protection layers 119a and 119b may be formed as a solder mask define (SMD) type configured to only partially expose the pads 115S, 115G, 115P, and 115T.

The semiconductor device 120 may be adhered to the top surface 110T of the PCB 110. The semiconductor device 120 may be electrically connected to the PCB 110, for example, through the bonding wire 130. The bonding wire 130 may include, for example, one selected from the group including Au, Ag, Cu, Al, and any alloys thereof.

In some exemplary embodiments, the semiconductor device 120 may be, for example, a semiconductor chip, such as a memory device, a logic device (for example, a microprocessor, an analog device, or a digital signal processor), or a system on chip, which performs various functions. These chips may be formed on a die and may be formed, for example, from a wafer. The memory device may include, for example, a DRAM, an SRAM, a flash memory, an EEPROM, a PRAM, an MRAM, or an RRAM. In addition, the semiconductor device 120 may be a multi-chip device that has a structure in which at least two semiconductor chips are stacked.

The semiconductor device 120 may be adhered to the top surface 110T of the PCB 110, for example, through an adhesive member 124. The adhesive member 124 may be an adhesive layer, and more generally, in some instances may be an electrically insulative layer. Adhesive member 124 may be referred to as an intermediate layer in relation to the semiconductor device 120 and the PCB 110.

In some exemplary embodiments, the adhesive member 124 may include, for example, an adhesive film such as a non-conductive film (NCF), an anisotropic conductive film (ACF), or a UV film or may include a liquid adhesive such as an instant adhesive, a thermosetting adhesive, a laser hardening adhesive, an ultrasonic hardening adhesive, or a non-conductive paste (NCP).

Thermally conductive vias 117T may be formed in the top surface 110T of the PCB 110 to dissipate heat generated during the operation of the semiconductor device 120 to the outside. Specifically, a top surface 117TT of each of the thermally conductive vias 117T may be exposed through the top surface 110T of the PCB 110, and a bottom surface 117TB of each thereof may be connected to the ground pattern layer 113G or the power pattern layer 113P. The top surface 117TT of each of the thermally conductive vias 117T may be disposed substantially at the same level as the top surface 110T of the PCB 110.

When viewed from above, the thermally conductive vias 117T may be disposed in a region overlapping the semiconductor device 120, that is, in a region in which the semiconductor device 120 is disposed, and the top surfaces 117TT of the thermally conductive vias 117T may contact the adhesive member 124. Accordingly, the heat generated in the semiconductor device 120 may be dissipated toward the bottom surface 110B of the PCB 110. For example, the heat generated in the semiconductor device 120 may be dissipated from the bottom surface of the semiconductor device 120 to the outside of the semiconductor package 100 through the thermally conductive via 117T, the ground pattern layer 113G or the power pattern layer 113P (which are also thermally conductive), an electrically conductive via 117Eg or an electrically conductive via 117Ep (which are also thermally conductive), the peripheral wiring pattern layer 113U, and the ground pad 115G or the power pad 115P (all of which are also thermally conductive) in consecutive order. The adhesive member 124 may or may not have thermally conductive properties, but regardless it may be very thin compared to the semiconductor device 120 and the PCB 110, such that the proximity of the semiconductor device 120 to the PCB 110 (and particularly the thermally conductive vias 117T) allows heat transfer from the semiconductor device 120 to the thermally conductive via 117T and other thermally conductive components described above.

As illustrated in FIGS. 1A and 1B, when each of the thermally conductive vias 117T is disposed to overlap, when seen in a plan view, the electrically conductive via 117Eg connected to the ground pad 115G or the electrically conductive via 117Ep connected to the power pad 115P, the heat generated in the semiconductor device 120 may be transferred to the ground pad 115G or the power pad 115P through the shortest path.

In some exemplary embodiments, the thermally conductive pads 117T may include, for example, at least one selected from the group comprising Cu, Al, Ni, Pd, Ag, Cr, Ti, and Au. The thermally conductive vias 117T may include, although not the selected conductive metal, a material whose thermal conductivity is greater than a thermal conductivity of the prepreg layer 112a or the protection layer 119a of the PCB 110 without limitation.

In some exemplary embodiments, a material of the thermally conductive vias 117T may be different from a material of the electrically conductive vias 117E. In some exemplary embodiments, a material of the thermally conductive vias 117T may include substantially the same material as the electrically conductive vias 117E.

The thermally conductive vias 117T may be electrically insulated from the semiconductor device 120 and the signal pattern layer 113S in the PCB 110. For example, the thermally conductive vias 117T may contact an insulative adhesive layer (e.g., 124), or may abut a backside, insulative surface of semiconductor device 120. Thus, the thermally conductive vias 117T may be electrically insulated from the semiconductor device 120 based on their not electrically connecting to conductive terminals or lines or integrated circuitry of device 120. Similarly, the thermally conductive vias 117T may not electrically connect to signal pattern layers 113S. As described above, since the thermally conductive vias 117T may be electrically insulated from the semiconductor device 120 and the signal pattern layer 113S, even when the thermally conductive vias 117T include substantially the same material as the electrically conductive vias 117E, the thermally conductive vias 117T does not significantly influence the electrical characteristics of the semiconductor package 100.

The mold part 140 may be formed on the PCB 110 to cover the semiconductor device 120 and the bonding wire 130 and may function to protect the semiconductor device 120 and the bonding wire 130. The mold part 140 may include, for example, an electrically insulative material such as at least one selected from the group comprising a silicon-based material, a thermosetting material, a thermoplastic material, and a UV-treated material.

According to certain exemplary embodiments, the semiconductor package 100 includes the thermally conductive vias 117T connected to the ground pad 115G and/or the power pad 115P, and therefore does not need a separate pad structure for dissipating heat, thereby improving the heat dissipation characteristics of the semiconductor package 100 and thereby manufacturing the semiconductor package 100 to have a high integration at the same time.

Figure 2A:
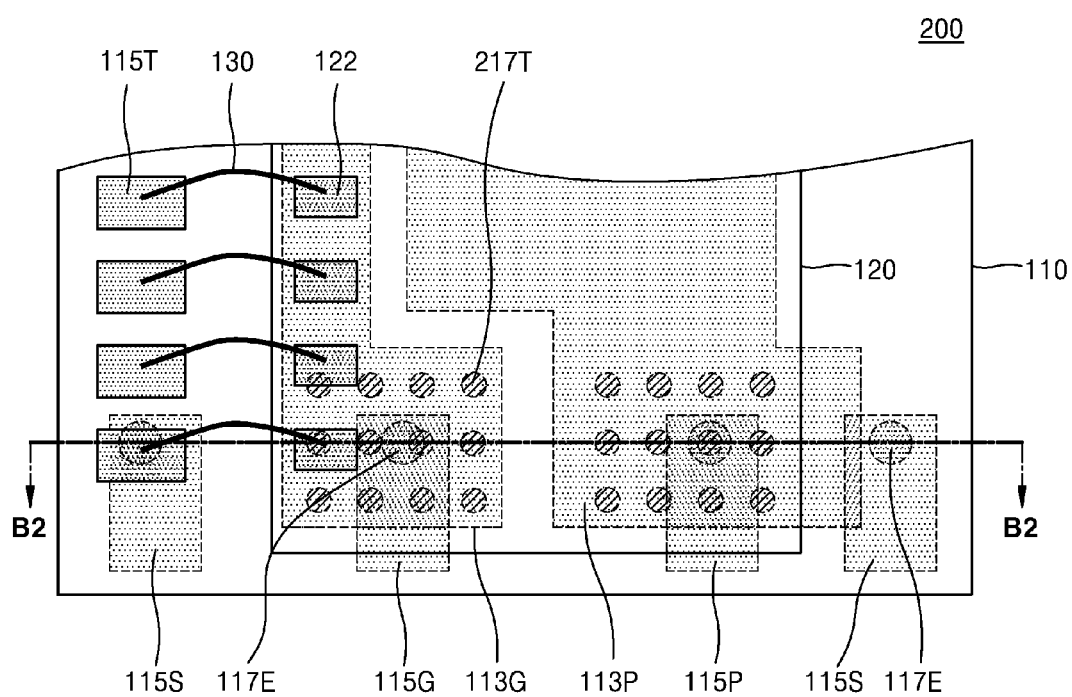
FIG. 2A is a plan view of a semiconductor package according to certain exemplary embodiments of the inventive concept.
Figure 2B:
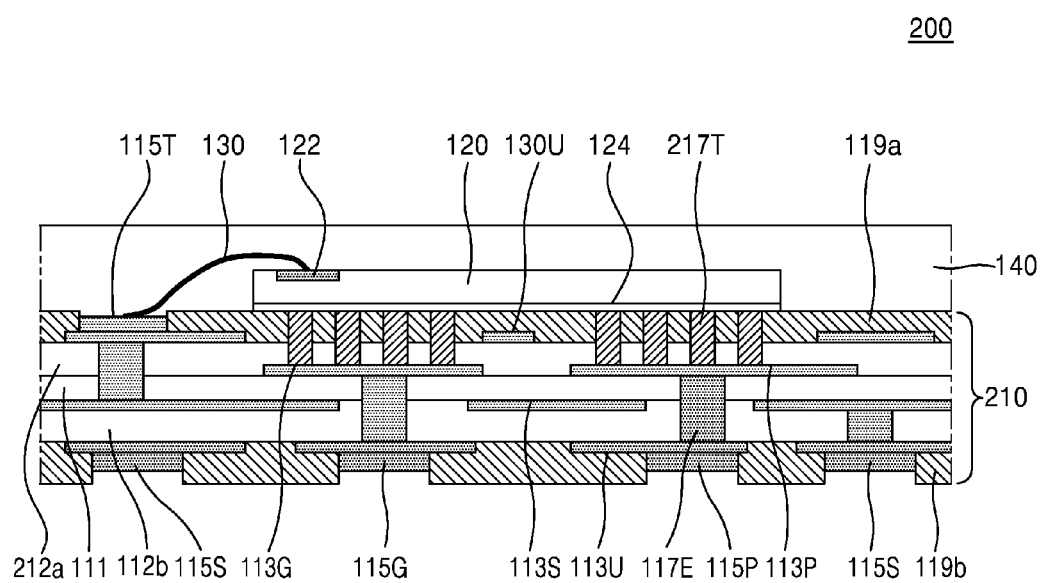
FIG. 2B is a cross-sectional view taken along line B2-B2 of FIG. 2A, according to certain exemplary embodiments of the inventive concept.

FIG. 2A is a plan view of a semiconductor package 200 according to certain exemplary embodiments of the inventive concept. FIG. 2B is a cross-sectional view taken along line B2-B2 of FIG. 2A, according to certain exemplary embodiments. In FIGS. 2A and 2B, like reference numerals as used in FIGS. 1A and 1B refer to like elements, and redundant descriptions thereof will be omitted for conciseness.

Referring to FIGS. 2A and 2B, the semiconductor package 200 may include a PCB 210, a semiconductor device 120, a bonding wire 130, and a mold part 140.

A specific shape, a placement structure, and a layout of the PCB 210 and the semiconductor device 120 illustrated in FIG. 2A are only for illustrative purposes and may be variously modified without departing from the scope of the inventive concept.

In FIG. 2A, illustrations of some configurations of the semiconductor package 200, such as a signal pattern layer 113S and protection layers 119a and 119b, will be omitted for clarity of description.

In certain exemplary embodiments, the PCB 210 may have a similar structure to that of the PCB 110 described with reference to FIGS. 1A and 1B, except for a structural difference in thermally conductive vias 217T, and the following description will focus on the thermal conductive vias 217T for conciseness.

The thermally conductive vias 117T, which may include a plurality of vias connected to each ground pattern layer 113G or power pattern layer 113P, may be formed at a top surface 210T of the PCB 210 to dissipate heat generated during the operation of the semiconductor device 120 to the outside. Top surfaces 217TT of the thermally conductive vias 217T may contact an adhesive member 124.

The thermally conductive vias 217T may have a pillar shape repeated in an array as illustrated in FIG. 2A and may be disposed in a region overlapping a ground pattern layer 113G or a power pattern layer 113P.

In the example depicted in FIG. 2A, the thermally conductive vias 217T may have a circular shape when seen in a plan view. However, the thermally conductive vias 217T are not limited thereto and may have various shapes such as an oval shape and a polygonal shape.

As illustrated in FIG. 2A, the thermally conductive vias 217T have the repeated pillar shape, thereby the thermally conductive vias 217T may improve a heat dissipation effect.

The top surface 217TT of each of the thermally conductive vias 217T may be exposed through the top surface 210T of the PCB 210, and a bottom surface 217TB of each thereof may be connected to the ground pattern layer 113G or the power pattern layer 113P, and thus may be thermally connected to ground pads 115G and power pads 115P. The top surface 217TT of each of the thermally conductive vias 217T may be disposed substantially at the same level as the top surface 210T of the PCB 210.

In some exemplary embodiments, the thermally conductive vias 217T may include, for example, at least one selected from the group comprising Cu, Al, Ni, Pd, Ag, Cr, Ti, and Au. The thermally conductive vias 217T may include, although not the selected conductive metal, a material a thermal conductivity of which is greater than a thermal conductivity of a prepreg layer 212a or the protection layer 119a of the PCB 210 without limitation.

In some exemplary embodiments, a material of the thermally conductive vias 217T may be different from a material of the electrically conductive vias 117E. In some exemplary embodiments, a material of the thermally conductive vias 217T may include substantially the same material as the electrically conductive vias 117E.

The thermally conductive vias 217T may be electrically insulated from the semiconductor device 120 and the signal pattern layer 113S in the PCB 210.

Figure 3A:
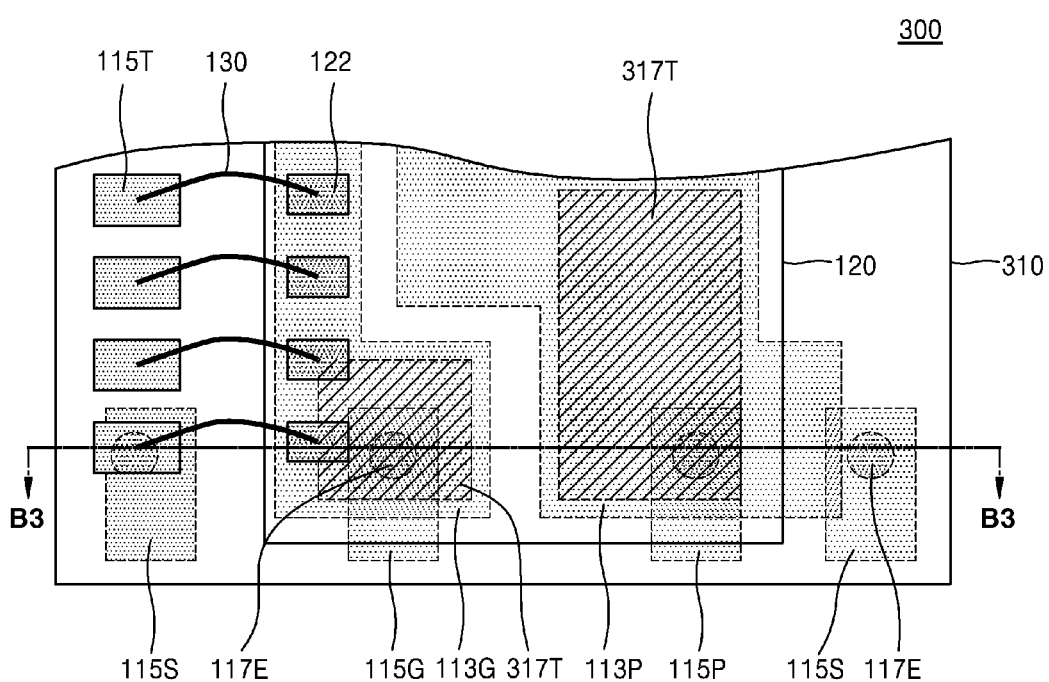
FIG. 3A is a plan view of a semiconductor package according to certain exemplary embodiments of the inventive concept.
Figure 3B:
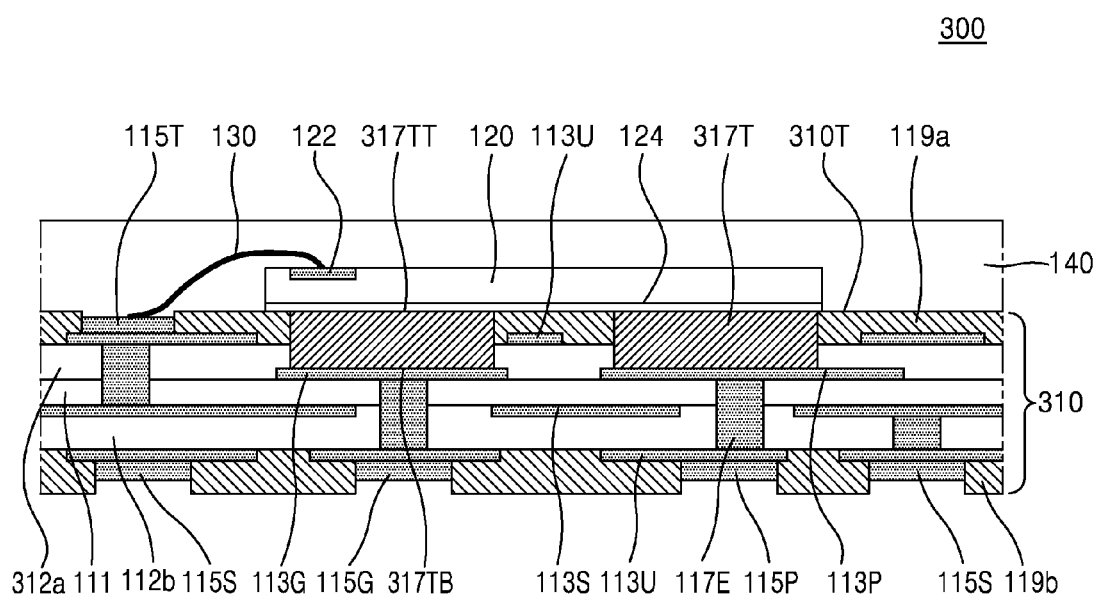
FIG. 3B is a cross-sectional view taken along line B3-B3 of FIG. 3A, according to certain exemplary embodiments of the inventive concept.

FIG. 3A is a plan view of a semiconductor package 300 according to certain exemplary embodiments of the inventive concept. FIG. 3B is a cross-sectional view taken along line B3-B3 of FIG. 3A, according to certain exemplary embodiments. In FIGS. 3A to 3B, like reference numerals as used in FIGS. 1A and 1B refer to like elements, and redundant descriptions thereof will be omitted for conciseness.

Referring to FIGS. 3A and 3B, the semiconductor package 300 may include a PCB 310, a semiconductor device 120, a bonding wire 130, and a mold part 140.

A specific shape, a placement structure, and a layout of the PCB 310 and the semiconductor device 120 illustrated in FIG. 3A are only for illustrative purposes and may be variously modified without departing from the scope of the inventive concept.

In FIG. 3A, illustrations of the some configurations of the semiconductor package 300, such as a signal pattern layer 113S and protection layers 119a and 119b, will be omitted for clarity of description.

In certain exemplary embodiments, the PCB 310 may have a similar structure to that of the PCB 110 described with reference to FIGS. 1A and 1B, except for a structural difference in thermally conductive vias 317T, and the following description will focus on the thermal conductive vias 317T for conciseness.

The thermally conductive vias 317T may be formed at a top surface 310T of the PCB 310 to dissipate heat generated during the operation of the semiconductor device 120. The top surfaces 317TT of the thermally conductive vias 317T may contact an adhesive member 124.

The thermally conductive vias 317T may each have a plate shape as illustrated in FIG. 3A and may be disposed in regions respectively overlapping a ground pattern layer 113G or a power pattern layer 113P. As illustrated in FIG. 3A, the thermally conductive vias 317T have the plate shape, thereby the thermally conductive vias 317T may improve a heat dissipation effect.

The top surface 317TT of each of the thermally conductive vias 317T may be exposed through the top surface 310T of the PCB 310, and a bottom surface 317TB of each thereof may be connected to the ground pattern layer 113G or the power pattern layer 113P. The top surface 317TT of each of the thermally conductive vias 317T may be disposed substantially at the same level as the top surface 310T of the PCB 310.

In some exemplary embodiments, the thermally conductive vias 317T may include, for example, at least one selected from the group comprising Cu, Al, Ni, Pd, Ag, Cr, Ti, and Au. The thermally conductive vias 317T may include, although not the selected conductive metal, a material whose thermal conductivity is greater than a thermal conductivity of a prepreg layer 312a or the protection layer 119a of the PCB 310 without limitation.

In some exemplary embodiments, a material of the thermally conductive vias 317T may be different from a material of the electrically conductive vias 117E. In some exemplary embodiments, the thermally conductive vias 317T may include substantially the same material as the electrically conductive vias 117E.

The thermally conductive vias 317T may be electrically insulated from the semiconductor device 120 and the signal pattern layer 113S in the PCB 310.

Figure 4:
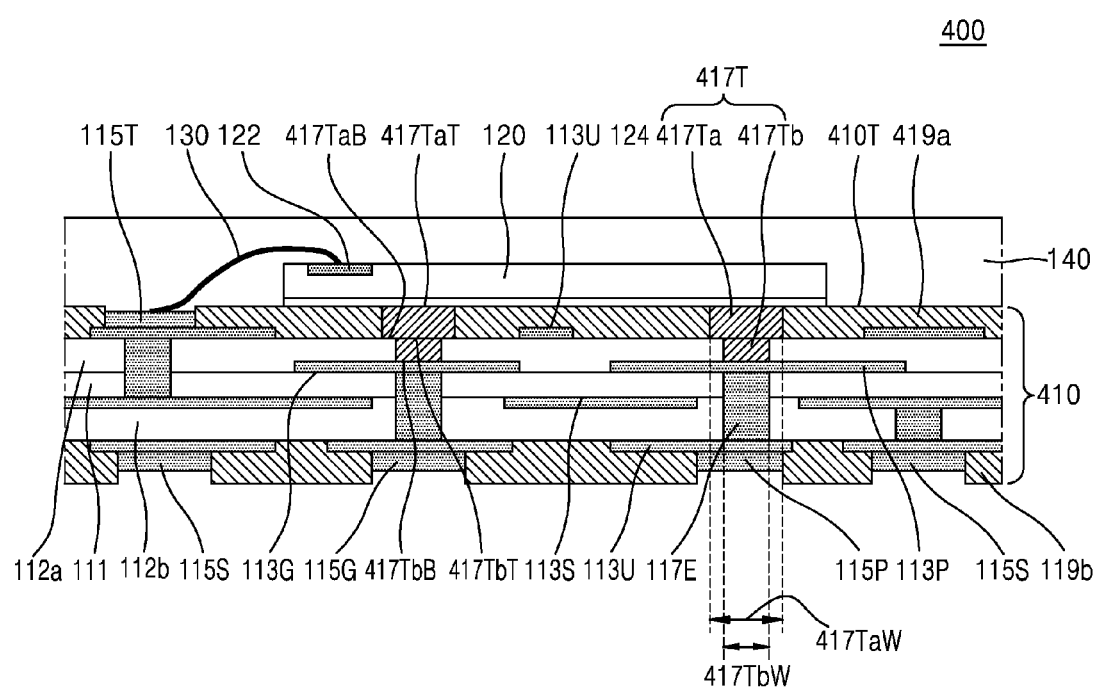
FIG. 4 is a cross-sectional view of a semiconductor package according to certain exemplary embodiments of the inventive concept.

FIG. 4 is a cross-sectional view of a semiconductor package 400 according to certain exemplary embodiments of the inventive concept. In FIG. 4, like reference numerals as used in FIGS. 1A and 1B refer to like elements, and redundant descriptions thereof will be omitted for conciseness.

Referring to FIG. 4, the semiconductor package 400 may include a PCB 410, a semiconductor device 120, a bonding wire 130, and a mold part 140.

In certain exemplary embodiments, the PCB 410 may have a similar structure to that of the PCB 110 described with reference to FIGS. 1A and 1B, except for a structural difference in thermally conductive vias 417T, and the following description will focus on the thermal conductive vias 417T for conciseness.

The thermally conductive vias 417T may be formed at a top surface 410T of the PCB 410 to dissipate heat generated during the operation of the semiconductor device 120 to the outside.

In some exemplary embodiments, each of the thermally conductive vias 417T may include a first sub thermally conductive via 417Ta and a second sub thermally conductive via 417Tb.

A top surface 417TaT of the first sub thermally conductive via 417Ta may be exposed to the outside of the PCB 410, and a bottom surface 417TaB thereof may contact a top surface 417TbT of the second sub thermally conductive via 417Tb. The top surface 417TaT of the first sub thermally conductive via 417Ta may be disposed substantially at the same level as the top surface 410T of the PCB 410.

The top surface 417TbT of the second sub thermally conductive via 417Tb may contact the bottom surface 417TaB of the first sub thermally conductive via 417Ta, and a bottom surface 417TbB thereof may contact a ground pattern layer 113G or a power pattern layer 113P.

In some exemplary embodiments, a width 417TaW (and/or area, from a top-down view) of the first sub thermally conductive via 417Ta may be greater than a width 417TbW (and/or area, from a top-down view) of the second sub thermally conductive via 417Tb.

In certain embodiments, a material of the first sub thermally conductive via 417Ta may be different from a material of the second sub thermally conductive via 417Tb. For example, the first sub thermally conductive via 417Ta may be simultaneously formed with an upper pad 115T to include substantially the same conductive material as the upper pad 115T, and a material of the second sub thermally conductive via 417Tb may be different from a material of the first sub thermally conductive via 417Ta and the upper pad 115T.

The first and second sub thermally conductive vias 117Ta and 417Tb may be electrically insulated from the semiconductor device 120 and the signal pattern layer 113S in the PCB 410.

Figure 5:
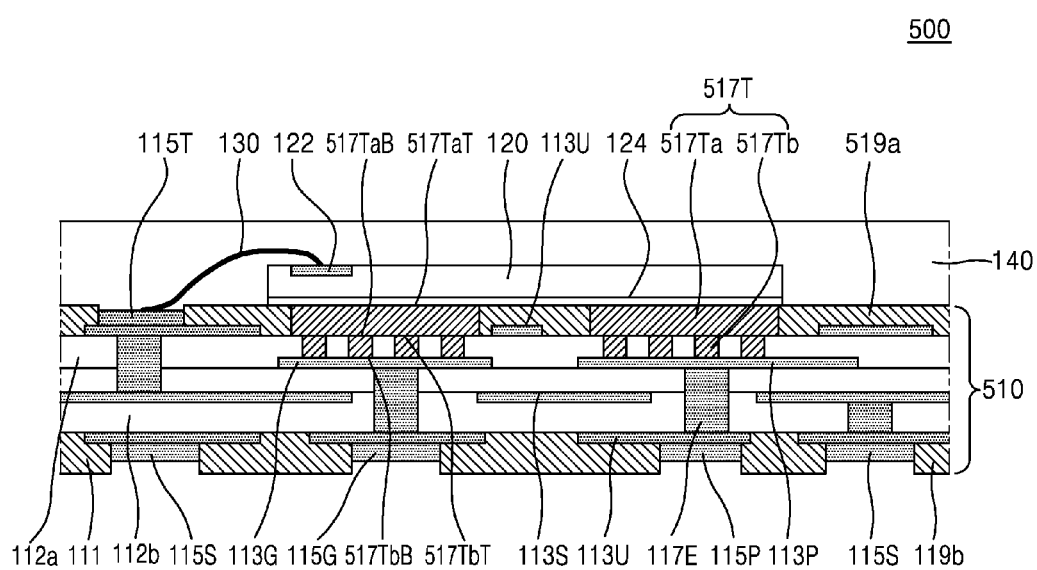
FIG. 5 is a cross-sectional view of a semiconductor package according to certain exemplary embodiments of the inventive concept.

FIG. 5 is a cross-sectional view of a semiconductor package 500 according to certain exemplary embodiments of the inventive concept. In FIG. 5, like reference numerals as used in FIGS. 1A and 1B refer to like elements, and redundant descriptions thereof will be omitted for conciseness.

Referring to FIG. 5, the semiconductor package 500 may include a PCB 510, a semiconductor device 120, a bonding wire 130, and a mold part 140.

In certain exemplary embodiments, the PCB 510 may have a similar structure to that of the PCB 110 described with reference to FIGS. 1A and 1B, except for a structural difference in thermally conductive vias 517T, and the following description will focus on the thermal conductive vias 517T for conciseness.

The thermally conductive vias 517T may be formed at a top surface 510T of the PCB 510 to dissipate heat generated during the operation of the semiconductor device 120 to the outside.

In some exemplary embodiments, each of the thermally conductive vias 517T may include a first sub thermally conductive via 517Ta and a plurality of second sub thermally conductive vias 517Tb, as opposed to a single, continuously formed thermally conductive via (e.g., formed of a continuous material) as described in the embodiments above.

A top surface 517TaT of the first sub thermally conductive via 517Ta may be exposed to the outside of the PCB 510, and a bottom surface 517TaB thereof may contact a top surface 517TbT of each of the second sub thermally conductive vias 517Tb. The top surface 517TaT of the first sub thermally conductive via 517Ta may be disposed substantially at the same level as the top surface 510T of the PCB 510.

A top surface 517TbT of each of the second sub thermally conductive vias 517Tb may contact the bottom surface 517TaB of the first sub thermally conductive via 517Ta, and a bottom surface 517TbB of each of thereof may contact a ground pattern layer 113G or a power pattern layer 113P.

Although not illustrated in a plan view, the first sub thermally conductive via 517Ta may have a similar plate shape to that of the thermally conductive vias 317T described with reference to FIGS. 3A and 3B. The second sub thermally conductive vias 517Tb may have a similar repeated shape to that of the thermally conductive vias 217T described with reference to FIGS. 2A and 2B.

A material of the first sub thermally conductive via 517Ta may be different from a material of the second sub thermally conductive vias 517Tb, but the inventive concept is not limited thereto.

The first and second sub thermally conductive vias 517Ta and 517Tb may be electrically insulated from the semiconductor device 120 and the signal pattern layer 113S in the PCB 510.

Figure 6:
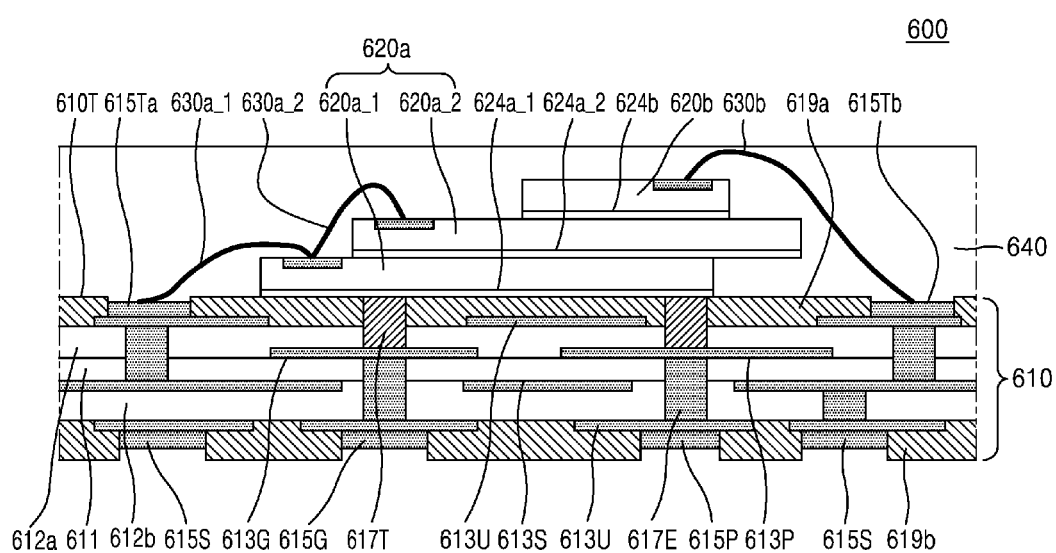
FIG. 6 is a cross-sectional view of a semiconductor package according to certain exemplary embodiments of the inventive concept.

FIG. 6 is a cross-sectional view of a semiconductor package 600 according to certain exemplary embodiments of the inventive concept.

Referring to FIG. 6, the semiconductor package 600 may include a PCB 610, first semiconductor chips 620a stacked on the PCB 610, a second semiconductor chip 620b adhering to the first semiconductor chips 620a, bonding wirings 630a_1, 630a_2, and 630b, a mold part 640.

The PCB 610 may be a multi-layer PCB including a plurality of wiring pattern layers 613P, 613G, 613S, and 613U thereinside. Specifically, the PCB 610 may include a base layer 611, wiring pattern layers 613P, 613G, and 613S, prepreg layers 612a and 612b, peripheral wiring pattern layers 113U, vias 617E and 617T, pads 615S, 615G, 615P, 615Ta, and 615Tb, and protection layers 619a and 619b. The wiring pattern layers 613P, 613G, and 613S may be disposed on a top surface and a bottom surface of the base layer 611, respectively. The prepreg layers 612a and 612b may cover the wiring pattern layers 613P, 613G, and 613S, respectively. The peripheral wiring pattern layers 113U may be disposed on the prepreg layers 612a and 612b. The vias 617E and 617T may penetrate at least one of the base layer 611 and the prepreg layers 612a and 612b.

Since the PCB 610 may have a similar structure to that of the PCB 110 described with reference to FIGS. 1A and 1B, redundant descriptions thereof will be omitted.

In certain exemplary embodiments, thermally conductive vias 617T are illustrated as having a similar structure to that of the thermally conductive vias 117T described with respect to FIGS. 1A and 1B but they are not limited thereto. For example, the thermally conductive vias 617T may have a substantially identical or similar structure to that of any one of the thermally conductive vias 217T, 317T, 417T, and 517T described with reference to FIGS. 2A to 5. Thus, aspects of FIGS. 2A to 5 may be combined with aspects of FIG. 6.

A plurality of first semiconductor chips 620a may be stacked in a cascade shape on a top surface 610T of the PCB 610.

Specifically, a first semiconductor chip 620a-1 may adhere to the PCB 610 through an adhesive member 624a-1, and a first semiconductor chip 620a-2 may adhere on the first semiconductor chip 620a-1 through an adhesive member 624a-2. Each of the adhesive members 624a-1 and 624a-2 may include, for example, an adhesive film such as a NCF, an ACF, or a UV film, or may include a liquid adhesive such as an instant adhesive, a thermosetting adhesive, a laser hardening adhesive, an ultrasonic hardening adhesive, or an NCP.

The stacked first semiconductor chips 620a may be electrically connected to the PCB 610 through the bonding wires 630a-1 and 630a-2. For example, the first semiconductor chip 620a-1 may be electrically connected to the PCB 610B through the bonding wire 630a-1 and may be electrically connected to the first semiconductor chip 620a-2 through the bonding wire 630a-2.

In the exemplary embodiment depicted in FIG. 6, the first semiconductor chips 620a have a structure in which two semiconductor chips are stacked, but the number of the first semiconductor chips 620a is not limited thereto.

In some exemplary embodiments, the first semiconductor chips 620a may function as a memory device. The memory device may include, for example, a DRAM, an SRAM, a flash memory, an EEPROM, a PRAM, an MRAM, or an RRAM.

The second semiconductor chip 620b may adhere to the first semiconductor chip 620a-2 through an adhesive member 624. The second semiconductor chip 620b may be electrically connected to the PCB 610 through the bonding wire 630b.

In some exemplary embodiments, the second semiconductor chip 620b may function as a logic device. For example, the second semiconductor chip 620b may function as a control device that transmits various command signals such as an enable/disable command signal, a selection command signal, and an address information signal to the first semiconductor chips 620a.

The mold part 640 may be formed on the PCB 610 to cover the first semiconductor chips 620a, the second semiconductor chip 620b, and the bonding wires 630a_1, 630a_2, and 630b. The mold part 640 may have a substantially identical or similar structure to that of the mold part 140 described with reference to FIG. 1B, and redundant descriptions thereof will be omitted.

In the case of the semiconductor package 600 including the plurality of semiconductor chips 620a and 620b, for, example, a system in package (SiP), heat dissipation capacity may have a major influence on the performance of the semiconductor package 600. In the exemplary embodiment of FIG. 6, the semiconductor package 600 includes the thermally conductive vias 617T, thereby efficiently dissipating heat generated in the semiconductor chips 620a and 620b to the outside of the semiconductor package 600.

Figure 7:
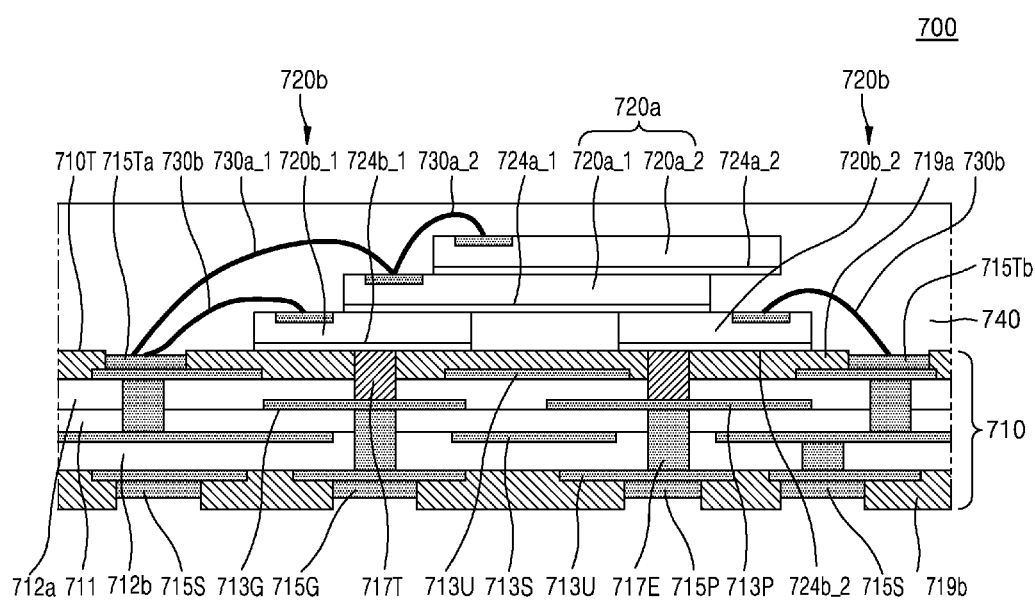
FIG. 7 is a cross-sectional view of a semiconductor package according to certain exemplary embodiments of the inventive concept.

FIG. 7 is a cross-sectional view of a semiconductor package 700 according to certain exemplary embodiments of the inventive concept.

Referring to FIG. 7, the semiconductor package 700 may include a PCB 710, second semiconductor chips 720b adhering on the PCB 710, first semiconductor chips 720a stacked on the second semiconductor chips 620b, bonding wirings 730a_1, 730a_2, and 730b, a mold part 740.

The PCB 710 may be a multi-layer PCB including a plurality of wiring pattern layers 713P, 713G, 713S, and 713U thereinside. Specifically, the PCB 710 may include a base layer 711, wiring pattern layers 713P, 713G, and 713S, prepreg layers 712a and 712b, peripheral wiring pattern layers 113U, vias 717E and 717T, pads 715S, 715G, 715P, 715Ta, and 715Tb, and protection layers 719a and 719b. The wiring pattern layers 713P, 713G, and 713S may be disposed at a top surface and a bottom surface of the base layer 711, respectively. The prepreg layers 712a and 712b may cover the wiring pattern layers 713P, 713G, and 713S, respectively. The peripheral wiring pattern layers 113U may be disposed on the prepreg layers 712a and 712b. The vias 717E and 717T may penetrate at least one of the base layer 711 and the prepreg layers 712a and 712b.

The PCB 710 may have a similar structure to that of the PCB 110 described with reference to FIGS. 1A and 1B, and redundant descriptions thereof will be omitted.

In the exemplary embodiment of FIG. 7, thermally conductive vias 717T are illustrated as having a similar structure to that of the thermally conductive vias 117T described with respect to FIGS. 1A and 1B but are not limited thereto. For example, the thermally conductive vias 717T may have a substantially identical or similar structure to that of any one of the thermally conductive vias 217T, 317T, 417T, and 517T described with reference to FIGS. 2A to 5.

The first semiconductor chips 720a may function as a memory device. The memory device may include, for example, a DRAM, an SRAM, a flash memory, an EEPROM, a PRAM, an MRAM, or an RRAM.

The second semiconductor chips 720b may function as a logic device. For example, the second semiconductor chips 720b may function as a control device that transmits various command signals such as an enable/disable command signal, a selection command signal, and an address information signal to the first semiconductor chips 720a.

Each of a plurality of second semiconductor chips 720b may adhere to a top surface 710T of the PCB 710. Specifically, the second semiconductor chip 720b-1 may adhere on the PCB 710 through an adhesive member 724b-1, and the second semiconductor chip 720b-2 may adhere on the PCB 710 through an adhesive member 724b-2. The second semiconductor chips 720b may be electrically connected to the PCB 710 through the bonding wire 730b.

A plurality of first semiconductor chips 720a may be stacked in a cascade shape on the second semiconductor chips 720b. Specifically, the first semiconductor chip 720a-1 may adhere to the second semiconductor chips 720b through the adhesive member 724a-1, and the first semiconductor chip 720a-2 may adhere to the first semiconductor chip 720a-1 through the adhesive member 724a-2. The first semiconductor chip 720a-1 may be electrically connected to the PCB 710 through the bonding wire 730a-1 and may be electrically connected to the first semiconductor chip 720*a*-2 through the bonding wire 730*a*-2.

The mold part 740 may be formed on the PCB 710 to cover the first semiconductor chips 720*a*, the second semiconductor chips 720*b*, and the bonding wires 730*a*_1, 730*a*_2, and 730*b*. The mold part 740 may have a substantially identical or similar structure to that of the mold part 140 described with reference to FIG. 1B, and redundant descriptions thereof will be omitted.

The second semiconductor chips 720*b* operable as a control device may generate more heat compared to the first semiconductor chips 720*a* operable as a memory device. In the present exemplary example, the second semiconductor chips 720*b* are disposed adjacent to the thermally conductive vias 717T of the PCB 710, thereby more efficiently dissipating the heat generated in the second semiconductor chips 720*b*.

Figure 8:
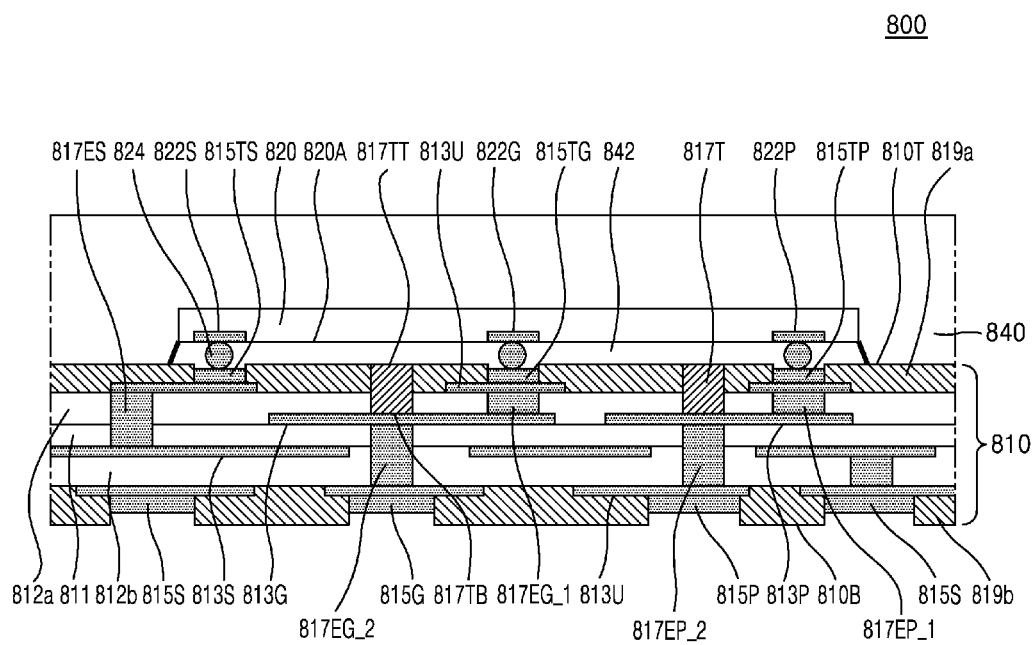
FIG. 8 is a cross-sectional view of a semiconductor package according to certain exemplary embodiments of the inventive concept.

FIG. 8 is a cross-sectional view of a semiconductor package 800 according to certain exemplary embodiments of the inventive concept. In FIG. 8, like reference numerals as used in FIGS. 1A and 1B refer to like elements, and redundant descriptions thereof will be omitted for conciseness.

Referring to FIG. 8, the semiconductor package 800 may include a PCB 810, a semiconductor device 820, chip connecting members 824, and a mold part 840.

The PCB 810 may be a multi-layer PCB including a plurality of wiring pattern layers 813P, 813G, 813S, and 813U thereinside. Specifically, the PCB 810 may include a base layer 811, wiring pattern layers 813P, 813G, and 813S, prepreg layers 812*a* and 812*b*, peripheral wiring pattern layers 813U, electrically conductive vias 817ES, 817EG_1, 817EG_2, 817EP_1, and 817EP_2, thermally conductive vias 817T, pads 815S, 815G, 815P, 815TS, 815TG, and 815TP, and protection layers 819*a* and 819*b*. The wiring pattern layers 813P, 813G, and 813S may be disposed on a top surface and a bottom surface of the base layer 811, respectively. The prepreg layers 812*a* and 812*b* may cover the wiring pattern layers 813P, 813G, and 813S, respectively. The peripheral wiring pattern layers 813U may be disposed on the prepreg layers 812*a* and 812*b*. The electrically conductive vias 817ES, 817EG_1, 817EG_2, 817EP_1, and 817EP_2 may penetrate at least one of the base layer 813 and the prepreg layers 812*a* and 812*b*.

Each of the base layer 811, the wiring pattern layers 813P, 813G, 813S, and 813U, the prepreg layers 812*a*, 812*b*, the electrically conductive vias 817ES, 817EG_1, 817EG_2, 817EP_1, and 817EP_2, the thermally conductive vias 817T, the pads 815S, 815G, 815P, 815TS, 815TG, and 815TP, and the protection layers 819*a* and 819*b* may have a similar structure or material to that of each of the base layer 111, the wiring pattern layers 113P, 113G, 113S, and 113U, the prepreg layers 112*a* and 112*b*, the electrically conductive vias 117E, the thermally conductive vias 117T, the pads 115S, 115G, 115P, and 115T, and the protection layers 119*a* and 119*b* described with reference to FIGS. 1A and 1B, and redundant descriptions thereof will be omitted.

Since an active surface 820A of semiconductor device 820 (which may be a semiconductor chip and is referred to below as a semiconductor chip 820) is disposed to face the PCB 810, the semiconductor chip 820 may be mounted on a top surface of the PCB 810 through flip-chip bonding. The semiconductor chip 820 may be any one of a memory chip or a logic chip and may be at least one semiconductor chip formed by stacking the memory chip or the logic chip.

As illustrated in FIG. 8, when the semiconductor chip 820 is mounted through flip-chip bonding, the semiconductor chip 820 may be connected to the PCB 810, for example, through the chip connection members 824 such as a bump.

In some exemplary embodiments, an underfill part 842 may be formed to fill a space between the semiconductor chip 820 and the PCB 810. The underfill part 842 may include substantially the same material as the mold part 840 but is not limited thereto. As such, the underfill part 842, also referred to as an underfill layer, may be an insulative layer formed of an insulating material. Underfill part 842 may be referred to as an intermediate layer in relation to the semiconductor chip 820 and the PCB 810.

In some exemplary embodiments, unlike as in FIG. 8, the space between the semiconductor chip 820 and the PCB 810 may be integrally filled with the mold part 840 through a molded underfill (MUF) process without the separate underfill part 842.

A chip signal pad 822S, a chip ground pad 822G, and a chip power pad 822P may be disposed on the active surface 820A of the semiconductor chip 820. In the present exemplary embodiment, all of the chip signal pad 833S, the chip ground pad 822G, and the chip power pad 822P are illustrated as being disposed on the same cross-section for convenience of description, but the placement structure and the number of these pads 822S, 822G, and 822P are not limited thereto.

The chip signal pad 822S, the chip ground pad 822G, and the chip power pad 822P may be electrically connected to an upper signal pad 815TS, an upper ground pad 815TG, and an upper power pad 815TP through the chip connection members 824, respectively. In addition, the upper signal pad 815TS, the upper ground pad 815TG, and the upper power pad 815TP may be electrically connected to the signal pattern layer 813S, the ground pattern layer 813G, and the power pattern layer 813P through the respective electrically conductive vias 817ES, 817EG_1, and 817EP_1.

The thermally conductive vias 817T may be formed at a top surface 810T of the PCB 810 to dissipate heat generated during the operation of the semiconductor chip 820 to the outside.

In some exemplary embodiments, the thermally conductive vias 817T may include, for example, at least one selected from the group comprising Cu, Al, Ni, Pd, Ag, Cr, Ti, and Au. The thermally conductive vias 817T may include, although not the selected conductive metal, a material whose thermal conductivity is greater than a thermal conductivity of the prepreg layer 812*a* or the protection layer 819*a* of the PCB 810 without limitation.

Top surfaces 817TT of the thermally conductive vias 817T may contact the underfill part 842, and bottom surfaces 817TB thereof may contact the ground pattern layer 813G or the power pattern layer 813P. The thermally conductive vias 817T may be electrically insulated from the signal pattern layer 113S and the electrically conductive vias 817ES, 817EG_1, and 817EP_1 in the PCB 810.

As described above, the PCB 810 includes the thermally conductive vias 817T, thereby more efficiently dissipating heat generated in the semiconductor chip 812.

In the exemplary embodiment of FIG. 8, the thermally conductive vias 817T are illustrated as having a similar structure to that of the thermally conductive vias 117T described with respect to FIGS. 1A and 1B, but they are not limited thereto. For example, the thermally conductive vias 817T may have a substantially identical or similar structure to that of any one of the thermally conductive vias 217T, 317T, 417T, and 517T described with reference to FIGS. 2A to 5. Thus, aspects of FIGS. 2A to 5 may be combined with aspects of FIG. 8.

The mold part 840 may be formed on the PCB 810 to cover the semiconductor chip 820 and may function to protect the semiconductor chip 820. In the present exemplary embodiment, the mold part 840 is formed to cover a top surface of the semiconductor chip 82. On the other hand, the mold part 840 may be formed to the same level as the top surface of the semiconductor chip 820 to expose the top surface of the semiconductor chip 820 (which is actually a backside surface opposite to an active surface) to the outside.

FIGS. 9A to 9F are cross-sectional views of a method of manufacturing a semiconductor device, according to certain exemplary embodiments of the inventive concept. In FIGS. 9A to 9F, like reference numerals as used in FIGS. 1A to 7 refer to like elements, and redundant descriptions thereof will be omitted for conciseness.

Figure 9A:
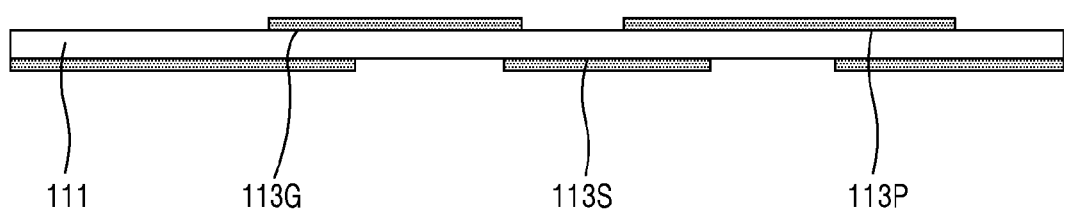
FIGS. 9A to 9F are cross-sectional views of a method of manufacturing a semiconductor device, according to certain exemplary embodiments of the inventive concept.

Referring to FIG. 9A, wiring pattern layers 113P, 113G, and 113S may be formed on a top surface and a bottom surface of a base layer 111.

For example, a ground pattern layer 113G and a power pattern layer 113P may be disposed on the top surface of the base layer 111, and a signal pattern layer 113S may be disposed on the bottom surface of the base layer 111, but the placement structure of the wiring pattern layers 113P, 113G, and 113S are not limited thereto.

In some exemplary embodiments, each of the wiring pattern layers 113P, 113G, and 113S may be formed by performing a patterning process with respect to thin copper films (not shown) formed on the upper and bottom surfaces of the base layer 111.

Figure 9B:
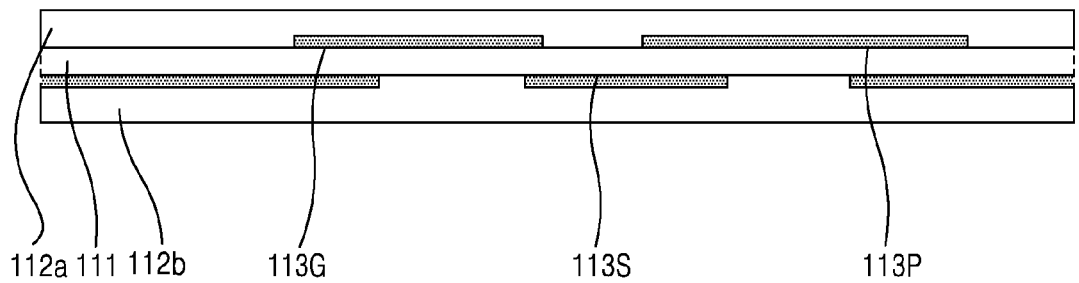

Referring to FIG. 9B, prepreg layers 112a and 112b may be formed to respectively cover the top surface and the bottom surface of the base layer 111, on which the wiring pattern layers 113P, 113G, and 113S are formed.

In some exemplary embodiments, each of the prepreg layers 112a and 112b may be formed by laminating one or more insulating films (not illustrated). The insulating film may be, for example, a prepreg film. Thus, the prepreg layers 112a and 112b are referred to here generally as insulating layers.

Figure 9C:
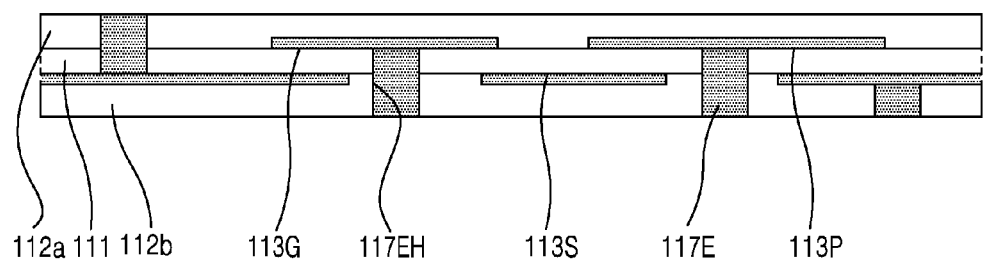

Referring to FIG. 9C, through-holes 117EH may be formed to penetrate at least one of the prepreg layers 112a and 112b and the base layer 111 and expose some regions of any one of the wiring pattern layers 113P, 113G, and 113S, and electrically conductive vias 117E may be formed to fill the through-holes 117EH.

In some exemplary embodiments, the through-holes 117EH may be formed through a laser drilling process. The electrically conductive vias 117E may be formed, for example, through sputtering, electroplating, electroless plating, and the like but are not limited thereto.

Figure 9D:
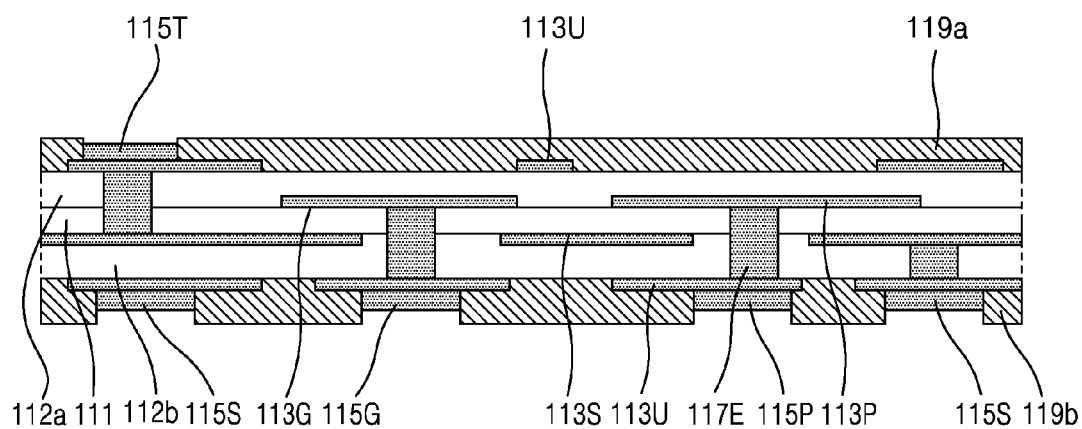

Referring to FIG. 9D, peripheral wiring pattern layers 113U may be formed on the prepreg layers 112a and 112b, protection layers 119a and 119b may be formed to respectively cover the peripheral wiring pattern layers 113U on the prepreg layers 112a and 112b. The pads 115S, 115G, 115P, and 115T may be electrically connected to the electrically conductive vias 117E, respectively.

The protection layers 119a and 119b, which may be electrically insulating layers, may include, for example, at least one selected from the group comprising a solder resist, a dry film resist, an electrodeposition resist, and a screen resist but may include, but are not particularly limited to, a material that is excellent in characteristics such as adhesion, electrical insulation, solder heat resistance, solvent resistance, and chemical resistance.

Figure 9E:
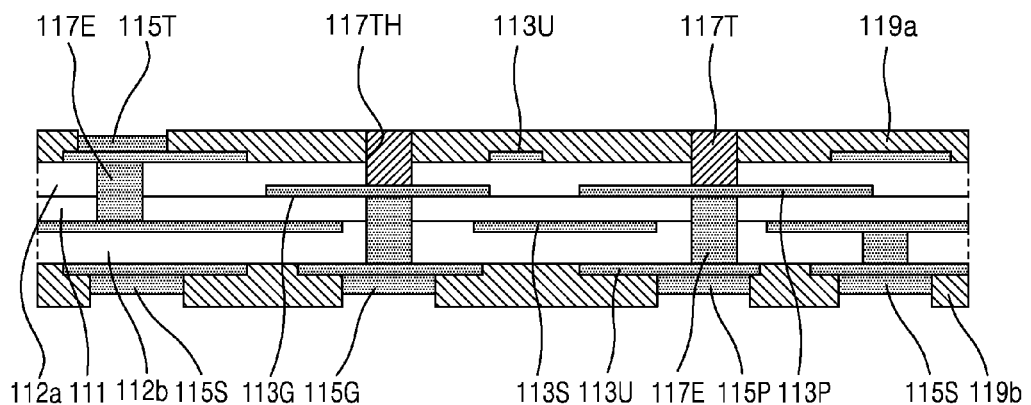

Referring to FIG. 9E, through-holes 117TH may be formed to penetrate the protection layer 119a and the prepreg layers 112a and 112b from a top surface 119aT of the protection layer 119a and expose some regions of the ground pattern layer 113G and/or the power pattern layer 113P, and thermally conductive vias 117T may be formed to fill the through-holes 117TH.

In some exemplary embodiments, the through-holes 117TH may be formed through a laser drilling process. The thermally conductive vias 117T may be formed, for example, through sputtering, electroplating, electroless plating, and the like but are not limited thereto.

Figure 9F:
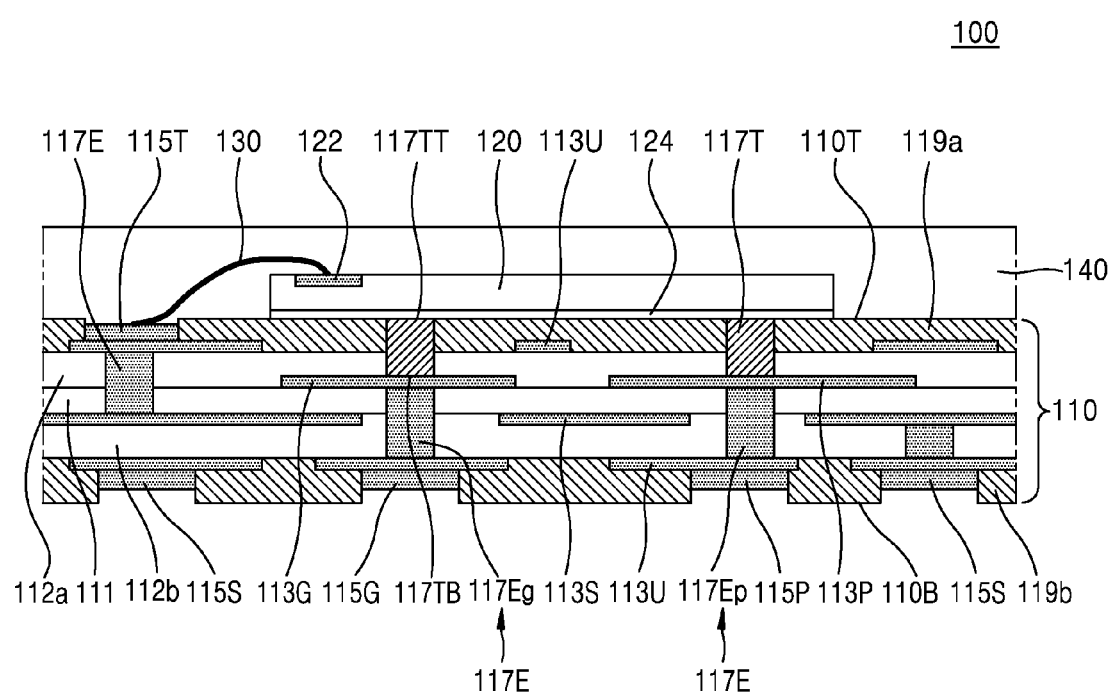

Referring to FIG. 9F, a semiconductor device 120 may be mounted on a PCB 110, and a mold part 140 may be formed to cover the semiconductor device 120 and the bonding wire 130.

The semiconductor device 120 may be adhered to a top surface 110T of the PCB 110 through an adhesive member 124 to cover the thermally conductive vias 117T exposed through the top surface 110T of the PCB 110. As such, the thermally conductive vias 117T may be disposed in a region overlapping the semiconductor device 120. Therefore, the thermally conductive vias 117T may transfer heat generated in the semiconductor device 120 to the outside of the PCB 110.

In some exemplary embodiments, the bonding wire 130 may be formed through a forward folded loop mode process in which one end of the bonding wire 130 is primarily ball-bonded to a chip pad 122 formed on a top surface of the semiconductor device 120, and the other end thereof is secondarily stitch-bonded to an upper pad 115T of the PCB 110. In some exemplary embodiments, the bonding wire 130 may be formed through a reverse loop mode process in which one end of the bonding wire 130 is primarily ball-bonded to the upper pad 115T of the PCB 110, and the other end thereof is secondarily stitch-bonded to a conductive bump (not illustrated) pre-formed in the chip pad 122.

A process of forming the mold part 140 may include injecting a molding resin into a molding apparatus (not illustrated), and applying a pressure by using a pressurizing element (not illustrated) such as a press.

In some exemplary embodiments, the molding resin may include at least one selected from the group comprising an epoxy-group molding resin and a polyimide-group molding resin. The epoxy-group molding resin may be, for example, at least one selected from the group comprising a polycyclic aromatic epoxy resin, a bisphenol-group epoxy resin, a naphthalene-group epoxy resin, an o-cresol novolac epoxy resin, a dicyclopentadiene epoxy resin, a biphenyl-group epoxy resin, and a phenol novolac epoxy resin.

FIGS. 10A to 10D are cross-sectional views of a method of manufacturing a semiconductor package, according to certain exemplary embodiments of the inventive concept. In FIGS. 10A to 10D, like reference numerals as used in FIGS. 1A to 9F refer to like elements, and redundant descriptions thereof will be omitted for conciseness.

Figure 10A:
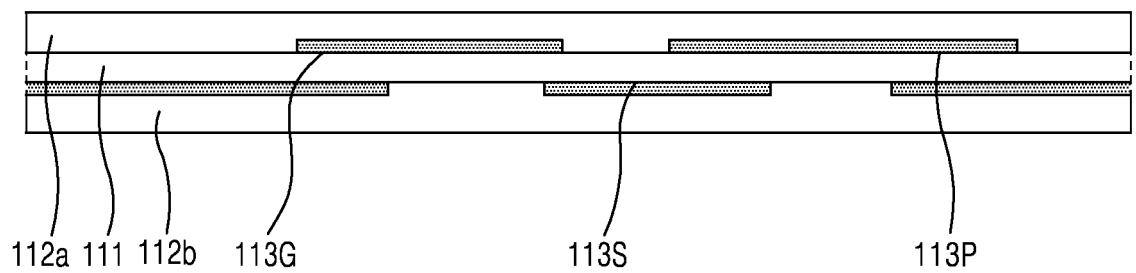
FIGS. 10A to 10D are cross-sectional views of a method of manufacturing a semiconductor device, according to certain exemplary embodiments of the inventive concept.

Referring to FIG. 10A, a base layer 111 may be prepared, and wiring pattern layers 113P, 113G, and 113S may be formed on a top surface and a bottom surface of the base layer 111. Prepreg layers 112a and 112b may be formed to respectively cover the top surface and the bottom surface of the base layer 111, on which the wiring pattern layers 113P, 113G, and 113S are formed.

A process of forming the base layer 111, the wiring pattern layers 113P, 113G, and 113S, and the prepreg layers 112a and 112*b* has been described with reference to FIGS. 9A and 9B, and redundant descriptions thereof will be omitted herein.

Figure 10B:
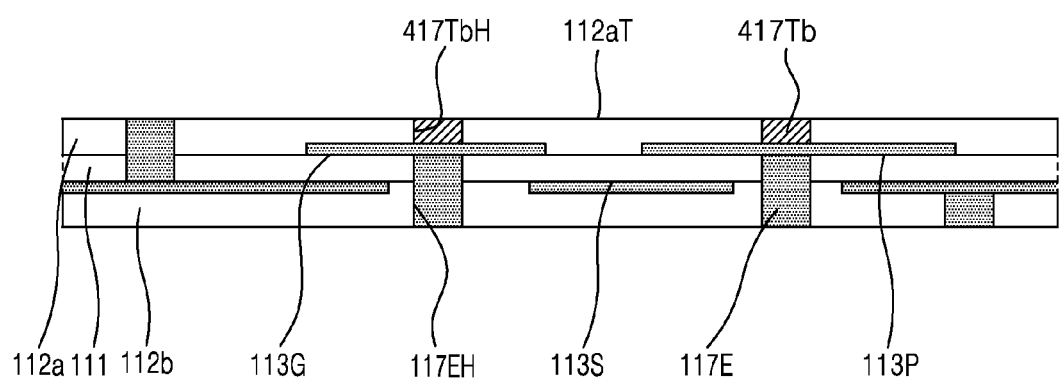

Referring to FIG. 10B, through-holes 117EH may be formed to penetrate at least one of the prepreg layers 112*a* and 112*b* and the base layer 111 and expose some regions of any one of the wiring pattern layers 113P, 113G, and 113S. In addition, through-holes 417TbH may be formed to penetrate the prepreg layer 112*a* from a top surface 112*a*T of the prepreg layer 112*a* and expose some regions of a ground pattern layer 113G and/or a power pattern layer 113P.

In a similar manner to that described with reference to FIG. 9C, electrically conductive vias 117E may be formed to fill the through-holes 117EH, and second sub thermally conductive vias 417Tb may be formed to fill the through-holes 417TbH.

In some exemplary embodiments, the electrically conductive vias 117E and the second sub thermally conductive vias 417Tb may be formed at the same time by using the same material but are not limited thereto.

Figure 10C:
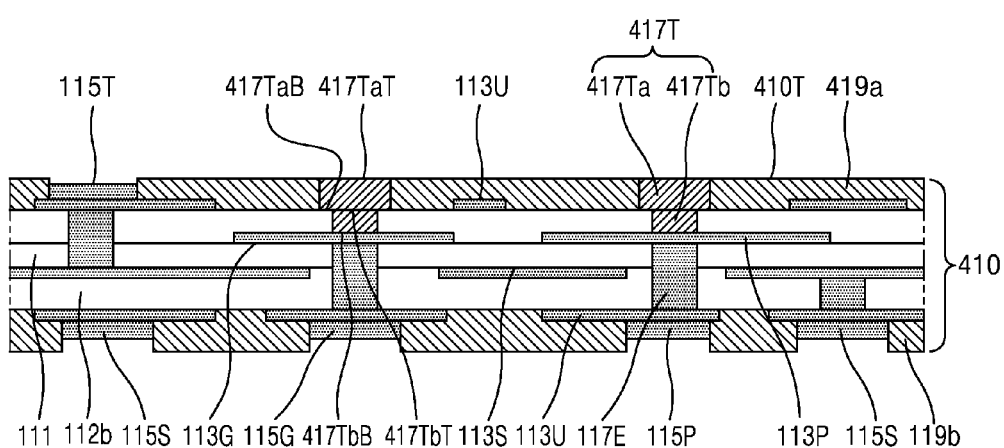

Referring to FIG. 10C, peripheral wiring pattern layers 113U may be formed on the prepreg layers 112*a* and 112*b*, and protection layers 419*a* and 119*b* may be formed to respectively cover the peripheral wiring pattern layers 113U on the prepreg layers 112*a* and 112*b*. In addition, pads 115S, 115G, 115P, and 115T, and first sub thermally conductive vias 417Ta may be formed. The pads 115S, 115G, 115P, and 115T may be electrically connected to the electrically conductive vias 117E, respectively. The first sub thermally conductive via 417Ta may be formed on the second sub thermally conductive via 417Tb.

Figure 10D:
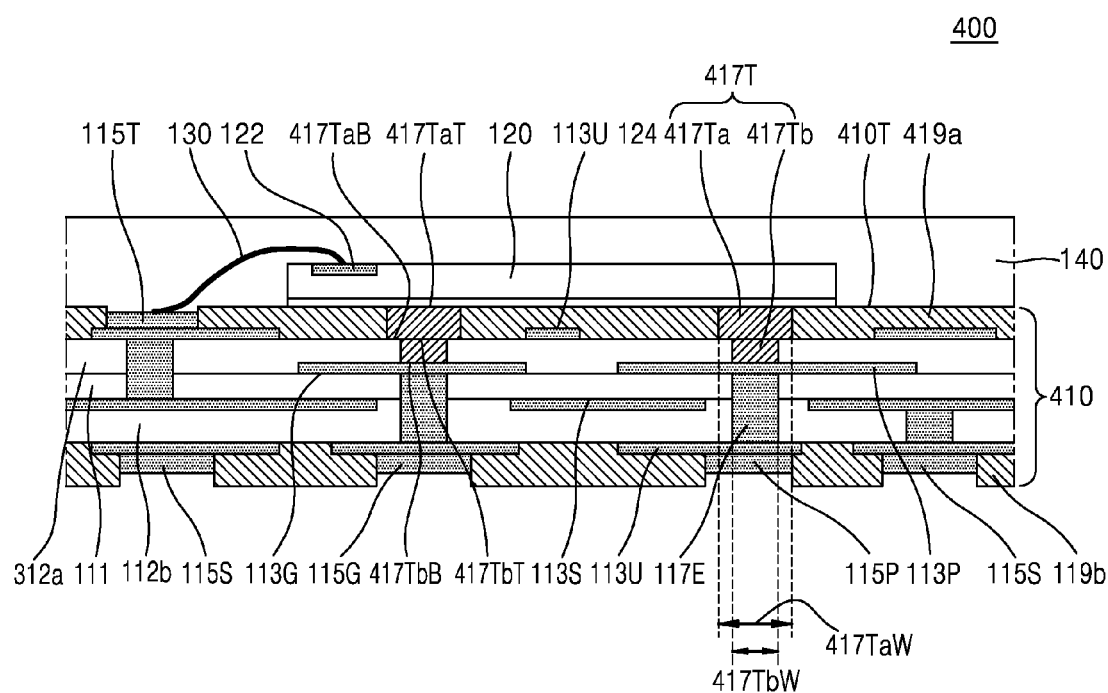

Referring to FIG. 10D, a semiconductor device 120 may be mounted on a PCB 410, and a mold part 140 may be formed to cover the semiconductor device 120 and bonding wire 130.

The semiconductor device 120 may be adhered to a top surface 410T of the PCB 410 through an adhesive member 124 to cover the thermally conductive vias 417T exposed through the top surface 410T of the PCB 410. For example, the thermally conductive vias 417T may be disposed in a region overlapping the semiconductor device 120. Therefore, the thermally conductive vias 417T may transfer heat generated in the semiconductor device 120 to the outside of the PCB 410.

Figure 11:
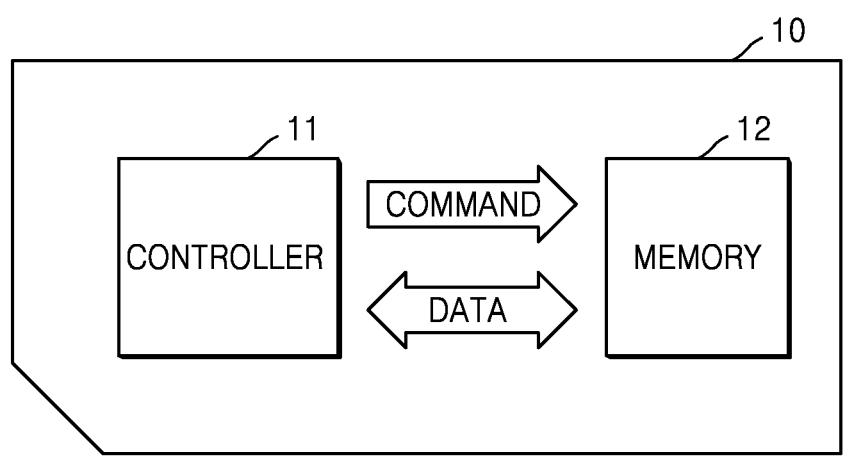
FIG. 11 is a block diagram of a memory card including a semiconductor package, according to some exemplary embodiments of the inventive concept.

FIG. 11 is a block diagram of an electronic device such as a memory card 10 including a semiconductor package, according to some exemplary embodiments of the inventive concept.

Referring to FIG. 11, in the memory card 10, a controller 11 and a memory 12 may be disposed to exchange an electrical signal with each other. For example, when the controller 11 issues a command, the memory 12 may transmit data.

A semiconductor package included in the controller 11 and/or the memory 12 may be substantially the same as any one of the semiconductor packages 100, 200, 300, 400, 500, 600, and 700 described with reference to FIGS. 1A to 10D.

The memory 12 may include a memory array (not illustrated) or a memory array bank (not illustrated).

The memory card 10 may be used in various cards, for example, various memory cards such as a memory stick card, a smart media (SM) card, a secure digital (SD) card, a mini-secure digital card (mini-SD), and a multimedia card (MMC). The memory card 10 may be an electronic device that benefits from the heat dissipation aspects described above, thereby improving operation of the memory card 10.

Figure 12:
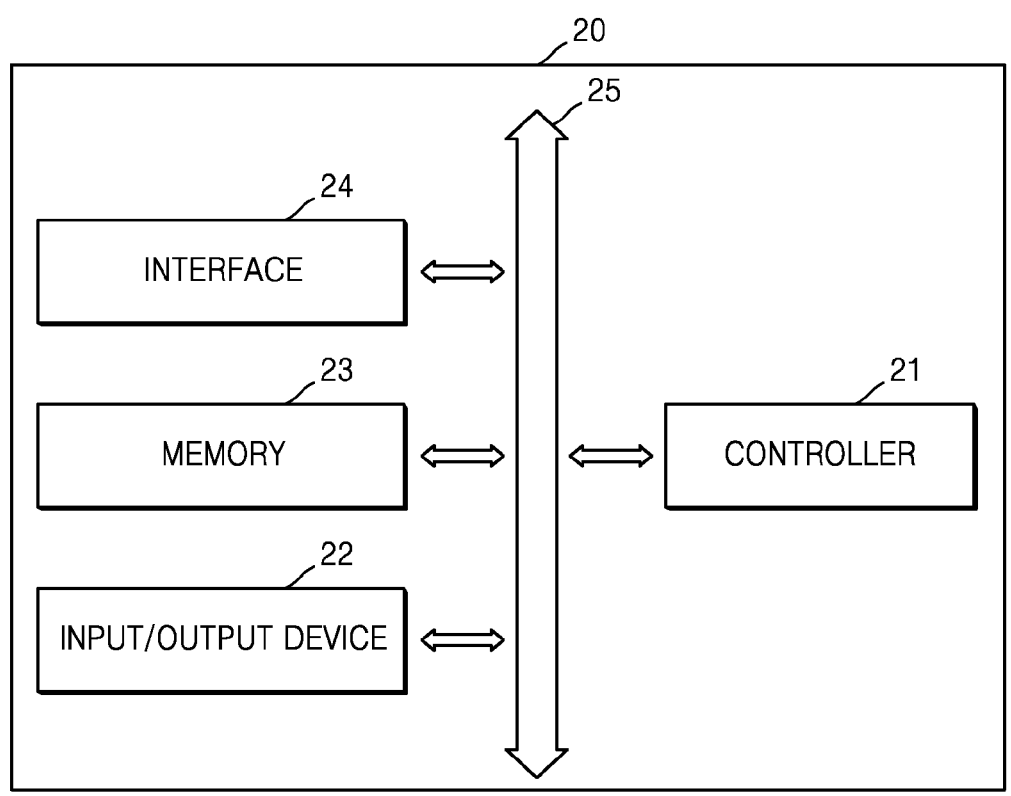
FIG. 12 is a block diagram of an electronic system including a semiconductor package, according to some exemplary embodiments of the inventive concept.

FIG. 12 is a block diagram of an electronic system 20 including a semiconductor package, according to some exemplary embodiments of the inventive concept. The electronic system may form part of an electronic device.

Referring to FIG. 12, the electronic system 20 may include a controller 21, an input/output device 22, a memory 23, and an interface 24. The electronic system 20 may be a mobile system or a system that transmits or receives information. The mobile system may be a PDA, a portable computer, a web tablet, a wireless phone, a mobile phone, a digital music player, or a memory card.

The controller 21 may function to execute a program or control the electronic system 20. The controller 21 may be, for example, a microprocessor, a digital signal processor, a microcontroller, or other similar devices. The input/output device 22 may be used to input or output data of the electronic system 20.

The electronic system 20 may be connected to, for example, a personal computer or a network to exchange data with external devices by using the input/output device 22. The input/output device 22 may be, for example, a keypad, a keyboard, or a display. The memory 23 may store a code or data for operating the controller 21 or may store data processed in the controller 21.

A semiconductor package included in the controller 21 and/or the memory 23 may be substantially the same as any one of the semiconductor packages 100, 200, 300, 400, 500, 600, and 700 described with reference to FIGS. 1A to 10D. The electronic device that includes the electronic system 20 may thus benefit from the heat dissipation aspects described above, thereby improving operation of the electronic device.

The interface 24 may be a data transmission path between the electronic system 20 and external other devices. The controller 21, the input/output device 22, the memory 23, and the interface 24 may communicate with one another through a bus 25.

For example, the electronic system 20 may be used in a mobile phone, an MP3 player, a navigation system, a portable multimedia player (PMP), a solid state disk (SSD), or household appliances.

Figure 13:
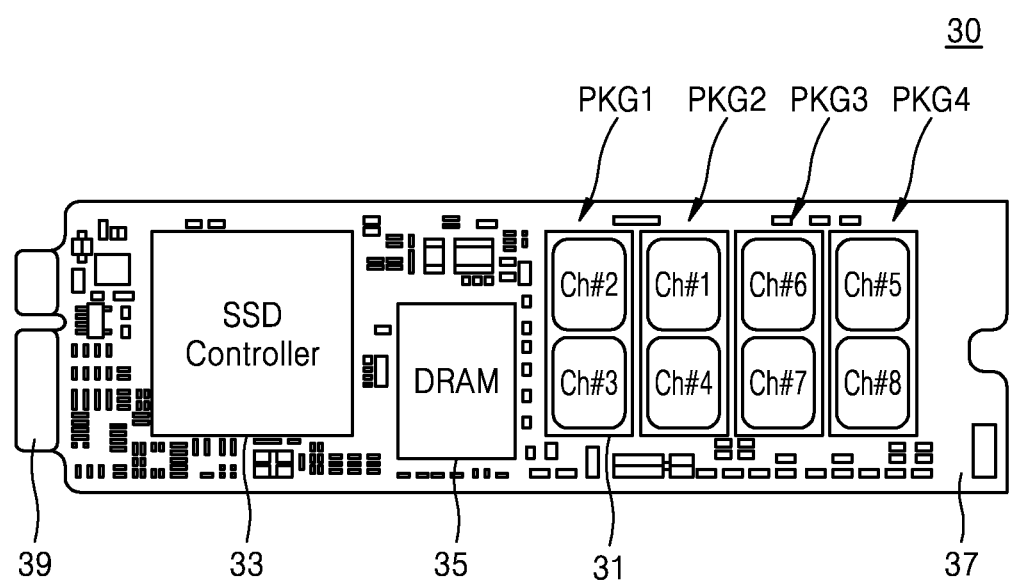
FIG. 13 is a plan view of a solid state disk (SSD) device adopting a semiconductor package, according to some exemplary embodiments of the inventive concept.

FIG. 13 is a plan view of an electronic device such as a solid state drive (SSD) device 30 adopting a semiconductor package, according to some exemplary embodiments of the inventive concept. Specifically, the SSD device 30 adopts the electronic system 20 of FIG. 12. As such, the electronic device benefits from the heat dissipation aspects described above, thereby improving operation of the electronic device.

Referring to FIG. 13, the SSD device 30 may include a memory package 31, an SSD controller 33, a dynamic random access memory (DRAM) 35, and a main board 37.

A semiconductor package included in at least one of the memory package 31, the SSD controller 33, and the DRAM 35 may be substantially the same as any one of the semiconductor packages 100, 200, 300, 400, 500, 600, and 700 described with reference to FIGS. 1A to 10D.

However, the inventive concept is not limited thereto, an SSD device using a semiconductor package having a different structure may also be included within the scope of the inventive concept. The semiconductor package having a different structure may adopt an internal sealant and an external sealant, which have different modulus.

The memory package 31 may be mounted on the main board 37 through an external connection member (not illustrated), and four memory packages PKG1, PKG2, PKG3, and PKG4 may be mounted as illustrated in FIG. 13. However, the inventive concept is not limited thereto, and more memory packages 31 may be mounted according to a channel support state of the SSD controller 33. When the memory package 31 has a multi-channel, the number of the memory packages 31 may be reduced to not more than four.

The memory package 31 may be mounted on the main board 37 in a ball grid array (BGA) type through an external connection member such as a solder ball. However, the inventive concept is not limited thereto, and the memory package 31 may also be mounted in other mounting types. For example, the memory package 31 may be mounted in a pin grid array (PGA) type, a tape carrier package (TCP) type, a chip-on-board (COB) type, a quad flat non-leaded (QFN) type, or a quad flat package (QFP).

In one embodiment, the SSD controller 33 may have eight channels, and the eight channels may be one-to-one connected to relevant channels of the four memory packages PKG1, PKG2, PKG3, and PKG4, thereby controlling the semiconductor chips in the memory package 31.

The SSD controller 33 may include a program that is able to transmit and receive a signal with external devices in a manner according to a serial advanced technology attachment (SATA) standard, a parallel advanced technology attachment (PATA) standard, or a small computer system interface (SCSI) standard. The SATA standard may include any SATA series such as SATA-1, SATA-2, SATA-3, or external SATA (e-SATA). The PATA standard may include any IDE series such as integrated drive electronics (IDE) or enhanced-IDE (E-IDE).

In addition, the SSD controller 33 may perform an EEC or FTL processing. The SSD controller 33 may also be mounted on the main board 37 in a package type. The SSD controller 33 may be mounted on the main board 37 in a BGA type, a PGA type, a TCP type, a COB type, a QFN type, or a QFP type like the memory package 32.

The DRAM 35 may be an auxiliary memory device and may function as a buffer in exchanging data between the SSD controller 33 and the memory package 31. The DRAM 35 may also be mounted on the main board 37 in various types such as a BGA type, a PGA type, a TCP type, a COB type, a QFN type, and a QFP type.

The main board 37 may be a PCB, a flexible PCB, a glass board, a ceramic board, or a tape board. The main board 37 may include, for example, a core board (not illustrated) having a top surface and a bottom surface, and resin layers (not illustrated) respectively formed on the top surface and the bottom surface. In addition, the resin layers may be formed in multi layered structures, and a signal layer, a ground layer, or a power layer forming a wiring pattern may be disposed between the multi layered structures. A separate wiring pattern may be formed on the resin layers. In FIG. 13, fine patterns illustrated on the main board 37 may include a wiring pattern or a plurality of passive elements. An interface 39 communicating with eternal devices may be formed at one side of the main board, for example, at a left side thereof.

Figure 14:
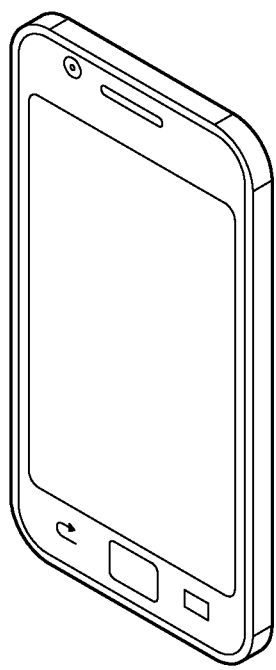
FIG. 14 is a perspective view of an electronic device, according to some exemplary embodiments of the inventive concept.

FIG. 14 is a perspective view of an electronic device 40, according to some exemplary embodiments of the inventive concept.

In one embodiment, in FIG. 14, the electronic system 20 of FIG. 13 is illustrated as being applied to a mobile phone 40. The electronic system 20 may also be applied to a portable notebook, an MP3 player, a navigation system, a solid state disk (SSD), a vehicle, or household appliances. As such, any of these devices may benefit from the heat dissipation aspects described above, thereby improving operation of the electronic devices.

Figure 15:
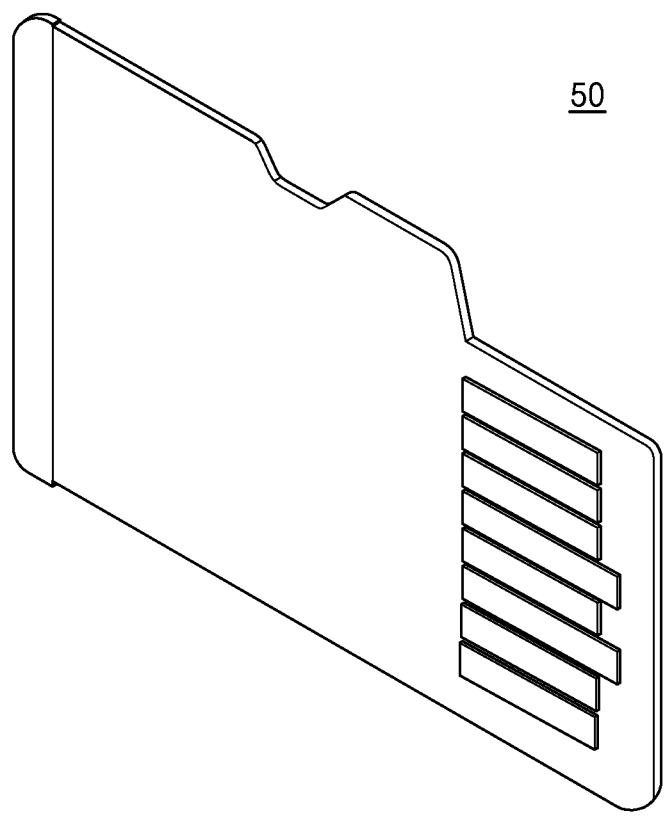
FIG. 15 is a perspective view of an electronic device according to exemplary embodiments of the inventive concept.

FIG. 15 is a perspective view of an electronic device 50 according to exemplary embodiments of the inventive concept.

The electronic device 50 may be, for example, a secure digital (SD) card or a micro SD card. A semiconductor package, which is substantially the same as any one of the semiconductor packages 100, 200, 300, 400, 500, 600, and 700 described with reference to FIGS. 1A to 10D, may be provided as an extension device such as the electronic device 50. As such, the electronic device 50 may benefit from the heat dissipation aspects described above, thereby improving operation of the electronic device.

According to certain aspects, as described in the various embodiments above, a semiconductor package includes a printed circuit board and a semiconductor device mounted on the printed circuit board. The printed circuit board may include at least a first power or ground pattern layer formed in the printed circuit board, at least a first power or ground pad formed on a bottom surface of the printed circuit board at least a first electrically conductive via that extends from the first power or ground pattern layer to the bottom surface of the printed circuit board to be connected to the first power or ground pad, and at least a first thermally conductive via that extends from the power or ground pattern layer to a top surface of the printed circuit board to be exposed to the outside of the printed circuit board. The thermally conductive via is disposed in a region overlapping the semiconductor device when seen in a plan view.

The semiconductor package may further include either an adhesive layer or an underfill layer disposed between the printed circuit board and the semiconductor device. A top surface of the thermally conductive via may contact the adhesive layer or the underfill layer.

The first thermally conductive via may overlap the first electrically conductive via when seen in a plan view.

The first thermally conductive via and the first electrically conductive via may be disposed in a region overlapping the first power or ground pad when seen in a plan view.

The first thermally conductive via may be disposed in a region overlapping the semiconductor device and the first power or ground pad when seen in a plan view.

The first thermally conductive via may include a continuous material extending from the first power or ground pattern layer through an insulating layer of the printed circuit board that forms the top surface of the printed circuit board, and may have one end electrically floating.

A material of the first thermally conductive via may be different from a material of the first electrically conductive via.

A thermal conductivity of the first thermally conductive via may be greater than a thermal conductivity of prepreg layers or a protection layer of the printed circuit board through which the first thermally conductive via passes.

The printed circuit board may include at least a first signal pattern layer formed thereinside, and the first thermally conductive via may be physically connected to the first signal pattern layer without being configured to electrically transmits a signal to any other electrically conductive layers.

The semiconductor device may include a stack of semiconductor chips mounted on the printed circuit board.

A top surface of the thermally conductive via may be disposed at a same level as the top surface of the printed circuit board.

Certain aspects of the various embodiments describe a semiconductor package including one or more semiconductor chips mounted on the printed circuit board, the one or more semiconductor chips include at least a first semiconductor chip adjacent to the printed circuit board, and an intermediate layer formed between a bottom of the first semiconductor chip and a top of the printed circuit board. The printed circuit board may include a first ground pad electrically connected to circuitry of the first semiconductor chip and for providing ground voltage to the first semiconductor chip, and a first power pad electrically connected to circuitry of the first semiconductor chip for providing power voltage to the first semiconductor chip. The printed circuit board may also include at least a first insulating layer contacting the intermediate layer, and at least a first thermally conductive via passing through the first insulating layer. The thermally conductive via may extend between the intermediate layer and one of the first ground pad and the first power pad, and may be electrically and thermally connected to one of the first ground pad and the first power pad, while contacting the intermediate layer. The first thermally conductive via may be disposed in a region overlapping the first semiconductor chip when seen in a plan view.

The electrically insulating layer may be one of an underfill layer contacting the printed circuit board and the first semiconductor chip, or an adhesive layer contacting the printed circuit board and the first semiconductor chip.

The first insulating layer may be a prepreg layer disposed on a core layer of the printed circuit board.

The first thermally conductive via may be formed of a material different from the first insulating layer, and may have a thermal conductivity greater than that of the first insulating layer.

The first thermally conductive via may extend to the surface of the printed circuit board and may be positioned to receive heat from the one or more semiconductor chips and dissipate the heat toward a bottom of the printed circuit board.

The first thermally conductive via may vertically overlap an electrically conductive through via connected to the first ground pad or first power pad. The first thermally conductive via may contact the intermediate layer at a top surface of the printed circuit board, and the electrically conductive through via may connect to the first ground pad or first power pad at a bottom of the printed circuit board.

The one or more semiconductor chips may include a plurality of semiconductor chips.

The power pad may be a pad positioned to distribute a voltage received from an external source to a power-receiving element of the first semiconductor chip (e.g., a portion of memory that receives a high voltage), and the ground pad may be a pad positioned to connect a ground of the external source to a ground-receiving element of the first semiconductor chip (e.g., a portion of memory that receives a low voltage, or ground voltage).

The heat dissipating via may have one end electrically floating (e.g., not connected to any other electrically conductive component) and one end electrically connected to a wiring distribution layer pattern electrically connected to the power pad or ground pad.

Certain aspects of the various embodiments describe an electronic device comprising a first semiconductor chip and a printed circuit board on which the first semiconductor chip is mounted. The printed circuit board includes a top surface and a bottom surface opposite the top surface, wherein an insulating layer of the printed circuit board is located at a top of the printed circuit board. The printed circuit may further include a first power pad electrically connected to circuitry of the first semiconductor chip for providing power voltage to the first semiconductor chip. The electronic device may further include a first thermally conductive via electrically connected to the first power pad, extending to the top surface of the printed circuit board, and positioned to receive heat from the first semiconductor chip and dissipate the heat toward the first power pad, the first thermally conductive via positioned in a region overlapping the first semiconductor chip when seen in a plan view.

The electronic device may further include an adhesive layer or underfill layer disposed between the first semiconductor chip and the printed circuit board and contacting the first semiconductor chip and the printed circuit board. The first thermally conductive via may contact the adhesive layer or underfill layer.

The electronic device may be, for example, a semiconductor package, a memory card, a solid state disk (SSD), a mobile phone, a portable notebook or tablet device, camera, or other consumer electronics device.

While aspects of the inventive concept have been particularly shown and described with reference to exemplary embodiments thereof, it will be understood that various changes in form and details may be made therein without departing from the spirit and scope of the following claims.

What is claimed is:

1. A semiconductor package comprising:
   a printed circuit board; and
   a semiconductor device mounted on the printed circuit board,
   wherein the printed circuit board comprises:
      at least a first power or ground pattern layer formed in the printed circuit board;
      at least a first power or ground pad vertically aligned with the first power or ground pattern layer, and formed on a bottom surface of the printed circuit board;
      at least a first electrically conductive via vertically aligned with the first power or ground pad, and that extends from the first power or ground pattern layer to the bottom surface of the printed circuit board to be connected to the first power or ground pad; and
      at least a first thermally conductive via vertically aligned with the first electrically conductive via, and that extends from the first power or ground pattern layer to a top surface of the printed circuit board to be exposed to the outside of the printed circuit board,
   wherein the first thermally conductive via, first electrically conductive via, first power or ground pad, and first power or ground pattern layer form a stack that is disposed in a region overlapping the semiconductor device when seen in a plan view,
   wherein the first electrically conductive via is electrically and thermally connected to a plurality of thermally conductive vias that include the first thermally conductive via, which plurality of first thermally conductive vias terminate at the semiconductor device, and
   wherein the at least the first power or ground pad is exposed through a protection layer at a bottom of the printed circuit board.

2. The semiconductor package of claim 1, further comprising either an adhesive layer or an underfill layer, disposed between the printed circuit board and the semiconductor device,
   wherein a top surface of the first thermally conductive via contacts the adhesive layer or the underfill layer.

3. The semiconductor package of claim 1, wherein:
   the semiconductor package is part of a memory card.

4. The semiconductor package of claim 1, wherein a material of the first thermally conductive via is different from a material of the first electrically conductive via.

5. The semiconductor package of claim 1, wherein a thermal conductivity of the first thermally conductive via is greater than a thermal conductivity of prepreg layers or a protection layer of the printed circuit board through which the first thermally conductive via passes.

6. The semiconductor package of claim 1, wherein the printed circuit board comprises at least a first signal pattern layer formed thereinside, and the first thermally conductive via is electrically insulated from the first signal pattern layer.

7. The semiconductor package of claim 6, wherein:
the semiconductor device includes a stack of semiconductor chips mounted on the printed circuit board.

8. The semiconductor package of claim 1, wherein a top surface of the first thermally conductive via is disposed at a same level as the top surface of the printed circuit board.

9. The semiconductor package of claim 1, wherein the semiconductor device is a first semiconductor chip, the semiconductor package further comprising:
a second semiconductor chip; and
an intermediate layer formed between a bottom of the first semiconductor chip and a top of the printed circuit board,
wherein the first semiconductor chip is adjacent to the printed circuit board,
wherein the first power or ground pad of the printed circuit board includes:
a first ground pad electrically connected to circuitry of the first semiconductor chip and for providing ground voltage to the first semiconductor chip, and a first power pad electrically connected to circuitry of the first semiconductor chip for providing power voltage to the first semiconductor chip,
wherein the printed circuit board further includes at least a first insulating layer contacting the intermediate layer, and
wherein the first thermally conductive via passes through the first insulating layer, extending between the intermediate layer and one of the first ground pad and the first power pad, electrically and thermally connected to one of the first ground pad and the first power pad, and contacting the intermediate layer.

10. The semiconductor package of claim 9, wherein the first insulating layer is one of an underfill layer contacting the printed circuit board and the first semiconductor chip, or an adhesive layer contacting the printed circuit board and the first semiconductor chip.

11. The semiconductor package of claim 9, wherein the first insulating layer is a prepreg layer disposed on a core layer of the printed circuit board.

12. The semiconductor package of claim 9, wherein the first thermally conductive via is formed of a material different from the first insulating layer, and has a thermal conductivity greater than that of the first insulating layer.

13. The semiconductor package of claim 9, wherein the first thermally conductive via extends to a surface of the printed circuit board and is positioned to receive heat from the first semiconductor chip and dissipate the heat toward a bottom of the printed circuit board.

14. The semiconductor package of claim 9, wherein the first semiconductor chip includes a plurality of semiconductor chips.

* * * * *